US007088758B2

(12) United States Patent  (10) Patent No.: US 7,088,758 B2
Sandstrom et al.  (45) Date of Patent: Aug. 8, 2006

(54) RELAX GAS DISCHARGE LASER LITHOGRAPHY LIGHT SOURCE

(75) Inventors: Richard L. Sandstrom, Encinitas, CA (US); William N. Partlo, Poway, CA (US); Daniel J. W. Brown, San Diego, CA (US); Thomas A. Yager, Encinitas, CA (US); Alexander I. Ershov, San Diego, CA (US); Robert J. Rafac, Carlsbad, CA (US); German E. Rylov, Poway, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/956,784

(22) Filed: Oct. 1, 2004

(65) Prior Publication Data

US 2005/0083983 A1  Apr. 21, 2005

Related U.S. Application Data

(63) Continuation-in-part of application No. 10/884,101, filed on Jul. 1, 2004, and a continuation-in-part of application No. 10/875,662, filed on Jun. 23, 2004, and a continuation-in-part of application No. 10/847,799, filed on May 18, 2004, and a continuation-in-part of application No. 10/808,157, filed on Mar. 23, 2004, and a continuation-in-part of application No. 10/701,280, filed on Nov. 3, 2003, which is a continuation-in-part of application No. 10/173,190, filed on Jun. 14, 2002, now Pat. No. 6,750,972, which is a continuation of application No. 09/918,773, filed on Jul. 27, 2001, now Pat. No. 6,671,294.

(51) Int. Cl.
*H01S 3/22* (2006.01)
(52) U.S. Cl. .......................... 372/55; 372/57
(58) Field of Classification Search ................ 372/55
See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,223,279 A | 9/1980 | Bradford, Jr. et al. | 331/94.5 |
| 4,410,992 A | 10/1983 | Javan | 372/32 |
| 4,455,658 A | 6/1984 | Sutter, Jr. | 372/38 |
| 4,504,964 A | 3/1985 | Cartz et al. | 378/119 |
| 4,536,884 A | 8/1985 | Weiss et al. | 378/119 |
| 4,538,291 A | 8/1985 | Iwamatsu | 378/119 |
| 4,550,408 A | 10/1985 | Karning et al. | 372/58 |
| 4,596,030 A | 6/1986 | Herziger et al. | 378/119 |
| 4,618,759 A | 10/1986 | Muller et al. | 219/121 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,697,270 A | 9/1987 | Galkowski | 372/34 |
| 4,751,723 A | 6/1988 | Gupta et al. | 378/119 |
| 4,752,946 A | 6/1988 | Gupta et al. | 378/119 |
| 4,785,192 A | 11/1988 | Bruning | 250/548 |
| 4,798,467 A | 1/1989 | Wyeth et al. | 356/349 |
| 4,817,101 A | 3/1989 | Wyeth et al. | 372/32 |
| 4,823,354 A | 4/1989 | Znotins et al. | 372/57 |
| 4,837,794 A | 6/1989 | Riordan et al. | 378/119 |
| 4,869,999 A | 9/1989 | Fukuda et al. | 430/311 |
| 4,881,231 A | 11/1989 | Jain | 372/32 |
| 4,883,352 A | 11/1989 | Bruning | 353/122 |
| 4,891,820 A | 1/1990 | Rando et al. | 372/93 |
| 4,937,619 A | 6/1990 | Fukuda et al. | 355/53 |
| 4,940,331 A | 7/1990 | Wyeth et al. | 356/349 |
| 4,959,840 A | 9/1990 | Akins et al. | 372/57 |
| 5,005,180 A | 4/1991 | Edelman et al. | 372/57 |
| 5,023,884 A | 6/1991 | Akins et al. | 372/57 |

| Patent | Kind | Date | Inventor | Class |
|---|---|---|---|---|
| 5,023,897 | A | 6/1991 | Neff et al. | 378/122 |
| 5,025,445 | A | 6/1991 | Anderson et al. | 372/20 |
| 5,025,446 | A | 6/1991 | Kuizenga | 372/21 |
| 5,027,076 | A | 6/1991 | Horsley et al. | 324/674 |
| 5,095,492 | A | 3/1992 | Sandstrom | 372/102 |
| 5,102,776 | A | 4/1992 | Hammer et al. | 430/311 |
| 5,126,638 | A | 6/1992 | Dethlefsen | 315/326 |
| 5,128,601 | A | 7/1992 | Orbach et al. | 372/29 |
| 5,142,166 | A | 8/1992 | Birx | 307/419 |
| 5,189,678 | A | 2/1993 | Ball et al. | 372/28 |
| 5,303,002 | A | 4/1994 | Yan | 355/53 |
| 5,313,481 | A | 5/1994 | Cook et al. | 372/37 |
| 5,315,611 | A | 5/1994 | Ball et al. | 372/56 |
| 5,359,620 | A | 10/1994 | Akins | 372/58 |
| 5,371,587 | A | 12/1994 | De Groot et al. | 356/349 |
| 5,373,515 | A | 12/1994 | Wakabayashi et al. | 372/20 |
| 5,411,224 | A | 5/1995 | Dearman et al. | 244/53 |
| 5,416,391 | A | 5/1995 | Correa et al. | 318/558 |
| 5,420,877 | A | 5/1995 | Sandstrom | 372/34 |
| 5,432,122 | A | 7/1995 | Chae | 437/101 |
| 5,440,578 | A | 8/1995 | Sandstrom | 372/59 |
| 5,448,580 | A | 9/1995 | Birx et al. | 372/38 |
| 5,471,965 | A | 12/1995 | Kapich | 123/565 |
| 5,504,795 | A | 4/1996 | McGeoch | 378/119 |
| 5,524,144 | A | 6/1996 | Suzuki | 359/176 |
| 5,691,989 | A | 11/1997 | Rakuljick | 372/20 |
| 5,706,301 | A | 1/1998 | Lagerstrom | 372/32 |
| 5,729,562 | A | 3/1998 | Birx et al. | 372/38 |
| 5,754,571 | A | 5/1998 | Endoh et al. | 372/20 |
| 5,763,930 | A | 6/1998 | Partlo | 250/504 |
| 5,771,258 | A | 6/1998 | Morton et al. | 372/57 |
| 5,835,512 | A | 11/1998 | Wada et al. | 372/13 |
| 5,852,621 | A | 12/1998 | Sandstrom | 372/25 |
| 5,856,991 | A | 1/1999 | Ershov | 372/57 |
| 5,863,017 | A | 1/1999 | Larson et al. | 248/176.1 |
| 5,866,871 | A | 2/1999 | Birx | 219/121 |
| 5,867,514 | A | 2/1999 | Anderson | 372/38 |
| 5,870,420 | A | 2/1999 | Webb | 372/58 |
| 5,936,988 | A | 8/1999 | Partlo et al. | 372/38 |
| 5,953,360 | A | 9/1999 | Vitruk et al. | 372/87 |
| 5,963,616 | A | 10/1999 | Silfvast et al. | 378/122 |
| 5,978,394 | A | 11/1999 | Newman et al. | 372/32 |
| 5,982,800 | A | 11/1999 | Ishihara et al. | 372/57 |
| 5,991,324 | A | 11/1999 | Knowles et al. | 372/57 |
| 6,005,879 | A | 12/1999 | Sandstrom et al. | 372/25 |
| 6,014,398 | A | 1/2000 | Hofmann et al. | 372/60 |
| 6,016,216 | A | 1/2000 | Chang | 359/285 |
| 6,016,325 | A | 1/2000 | Ness et al. | 372/38 |
| 6,018,537 | A | 1/2000 | Hofmann et al. | 372/25 |
| 6,028,880 | A | 2/2000 | Carlesi et al. | 372/58 |
| 6,031,241 | A | 2/2000 | Silfvast et al. | 378/119 |
| 6,034,978 | A | 3/2000 | Ujazdowski et al. | 372/34 |
| 6,039,850 | A | 3/2000 | Schulz | 204/192.15 |
| 6,051,841 | A | 4/2000 | Partlo | 250/504 |
| 6,064,072 | A | 5/2000 | Partlo et al. | 250/504 |
| 6,067,306 | A | 5/2000 | Sandstrom et al. | 372/38 |
| 6,067,311 | A | 5/2000 | Morton et al. | 372/57 |
| 6,078,599 | A | 6/2000 | Everage et al. | 372/20 |
| 6,094,448 | A | 7/2000 | Fomenkov et al. | 372/102 |
| 6,104,735 | A | 8/2000 | Webb | 372/37 |
| 6,109,574 | A | 8/2000 | Pan et al. | 248/176.1 |
| 6,128,323 | A | 10/2000 | Myers et al. | 372/38 |
| 6,133,986 | A | 10/2000 | Johnson | 355/67 |
| 6,143,661 | A | 11/2000 | Kousai et al. | 438/689 |
| 6,151,349 | A | 11/2000 | Gong et al. | 372/58 |
| 6,154,470 | A | 11/2000 | Basting et al. | 372/19 |
| 6,164,116 | A | 12/2000 | Rice et al. | 73/1.72 |
| 6,172,324 | B1 | 1/2001 | Birx | 219/121.57 |
| 6,177,301 | B1 | 1/2001 | Jung | 438/150 |
| 6,178,045 | B1 | 1/2001 | Cook et al. | 359/559 |
| 6,187,213 | B1 | 2/2001 | Smith et al. | 216/28 |
| 6,188,710 | B1 | 2/2001 | Besaucele et al. | 372/60 |
| 6,192,064 | B1 | 2/2001 | Algots et al. | 372/99 |
| 6,195,272 | B1 | 2/2001 | Pascente | 363/21 |
| 6,208,674 | B1 | 3/2001 | Webb et al. | 372/57 |
| 6,208,675 | B1 | 3/2001 | Webb | 372/58 |
| 6,212,211 | B1 | 4/2001 | Azzola et al. | 372/33 |
| 6,215,595 | B1 | 4/2001 | Yamazaki et al. | 359/623 |
| 6,219,368 | B1 | 4/2001 | Govorkov | 372/59 |
| 6,240,117 | B1 | 5/2001 | Gong et al. | 372/58 |
| 6,263,002 | B1 | 7/2001 | Hsu et al. | 372/6 |
| 6,282,218 | B1 | 8/2001 | Anderson | 372/38 |
| 6,300,176 | B1 | 10/2001 | Zhang et al. | 438/166 |
| 6,314,119 | B1 | 11/2001 | Morton | 372/57 |
| 6,316,338 | B1 | 11/2001 | Jung | 438/487 |
| 6,317,447 | B1 | 11/2001 | Partlo et al. | 372/57 |
| 6,322,625 | B1 | 11/2001 | Im | 117/43 |
| 6,330,261 | B1 | 12/2001 | Ishihara et al. | 372/38.1 |
| 6,348,357 | B1 | 2/2002 | Sano | 438/16 |
| 6,359,922 | B1 | 3/2002 | Partlo et al. | 372/58 |
| 6,368,945 | B1 | 4/2002 | Im | 438/487 |
| 6,381,257 | B1 | 4/2002 | Ershov et al. | 372/57 |
| 6,396,856 | B1 | 5/2002 | Sucha et al. | 372/25 |
| 6,404,536 | B1 | 6/2002 | Lean et al. | 359/308 |
| 6,414,979 | B1 | 7/2002 | Ujazdowski et al. | 372/87 |
| 6,452,199 | B1 | 9/2002 | Partlo et al. | 250/504 |
| 6,466,365 | B1 | 10/2002 | Maier et al. | 359/355 |
| 6,477,193 | B1 | 11/2002 | Oliver et al. | 372/58 |
| 6,493,374 | B1 | 12/2002 | Fomenkov et al. | 372/102 |
| 6,496,528 | B1 | 12/2002 | Titus et al. | 372/102 |
| 6,529,531 | B1 | 3/2003 | Everage et al. | 372/20 |
| 6,532,247 | B1 | 3/2003 | Spangler | 372/57 |
| 6,535,531 | B1 | 3/2003 | Smith et al. | 372/25 |
| 6,538,737 | B1 | 3/2003 | Sandstrom et al. | 356/333 |
| 6,549,551 | B1 | 4/2003 | Ness et al. | 372/38 |
| 6,555,449 | B1 | 4/2003 | Im et al. | 438/487 |
| 6,556,612 | B1 | 4/2003 | Ershov et al. | 372/103 |
| 6,563,077 | B1 | 5/2003 | Im | 219/121.65 |
| 6,566,667 | B1 | 5/2003 | Partlo et al. | 250/504 |
| 6,566,668 | B1 | 5/2003 | Rauch et al. | 250/504 |
| 6,567,450 | B1 | 5/2003 | Myers et al. | 372/55 |
| 6,573,531 | B1 | 6/2003 | Im et al. | 257/45 |
| 6,576,912 | B1 | 6/2003 | Visser et al. | 250/492.2 |
| 6,582,827 | B1 | 6/2003 | Im | 428/446 |
| 6,586,757 | B1 | 7/2003 | Melnychuk et al. | 250/504 |
| 6,618,421 | B1 | 9/2003 | Das et al. | 372/55 |
| 6,621,846 | B1 | 9/2003 | Sandstrom et al. | 372/57 |
| 6,625,191 | B1 | 9/2003 | Knowles et al. | 372/55 |
| 6,650,666 | B1 | 11/2003 | Spangler et al. | 372/20 |
| 6,671,294 | B1 | 12/2003 | Kroyan et al. | 372/20 |
| 6,687,562 | B1 | 2/2004 | Patel et al. | 700/121 |
| 6,690,704 | B1 | 2/2004 | Fallon et al. | 372/58 |
| 6,693,939 | B1 | 2/2004 | Klene et al. | 372/58 |
| 6,704,340 | B1 | 3/2004 | Ershov et al. | 372/58 |
| 6,721,340 | B1 | 4/2004 | Fomenkov et al. | 372/25 |
| 6,735,225 | B1 | 5/2004 | Albrecht et al. | 372/25 |
| 6,744,060 | B1 | 6/2004 | Ness et al. | 315/111.1 |
| 6,750,972 | B1 | 6/2004 | Sandstrom et al. | 356/454 |
| 6,757,316 | B1 | 6/2004 | Newman et al. | 372/57 |
| 6,782,031 | B1 | 8/2004 | Hofmann et al. | 372/90 |
| 6,815,700 | B1 | 11/2004 | Melnychuk et al. | 250/504 |
| 2001/0045974 | A1 | 11/2001 | Shoemaker et al. | 347/63 |
| 2001/0055364 | A1 | 12/2001 | Kandaka et al. | 378/119 |
| 2002/0099362 | A1* | 7/2002 | Hohla | 606/5 |
| 2002/0100882 | A1 | 8/2002 | Partlo et al. | 250/504 |
| 2002/0101589 | A1 | 8/2002 | Sandstrom et al. | 356/334 |
| 2002/0105994 | A1 | 8/2002 | Partlo et al. | 372/57 |
| 2002/0108398 | A1 | 8/2002 | Smith et al. | 63/32 |
| 2002/0154668 | A1 | 10/2002 | Knowles et al. | 372/55 |
| 2002/0167975 | A1 | 11/2002 | Spangler et al. | 372/20 |
| 2002/0167986 | A1 | 11/2002 | Pan et al. | 372/55 |
| 2002/0168049 | A1 | 11/2002 | Schriever et al. | 378/119 |
| 2002/0176469 | A1* | 11/2002 | Vogler et al. | 372/61 |
| 2003/0007138 | A1 | 1/2003 | Shigematsu et al. | 355/67 |
| 2003/0016447 | A1* | 1/2003 | Kato et al. | 359/569 |
| 2003/0068012 | A1 | 4/2003 | Ahmad et al. | 378/119 |

| | | | |
|---|---|---|---|
| 2003/0096489 A1 | 5/2003 | Im et al. | 438/487 |
| 2003/0099269 A1 | 5/2003 | Ershov et al. | 372/55 |
| 2003/0118072 A1 | 6/2003 | Wittak et al. | 372/58 |
| 2003/0119286 A1 | 6/2003 | Takeda et al. | 117/84 |
| 2003/0219056 A1 | 11/2003 | Yager et al. | 372/57 |
| 2004/0060504 A1 | 4/2004 | Takeda et al. | 117/84 |

FOREIGN PATENT DOCUMENTS

JP    2696285    9/1997

OTHER PUBLICATIONS

P. Kerkoc et al., "Molecular crystals for applications in acousto-optics," *Phys. A: Math Gen.* 32, No. 20 (May 21, 1999).

E. Young et al., Acousto-optics, deflectors, light modulation, modulators, bandwidth, design analysis, fabrication, impedance matching, light beams, wave interaction, *IEEE, Proceedings*, vol. 69, Jan. 1981, p. 54-64.

Apruzese, J.P., "X-Ray Laser Research Using Z Pinches," *Am. Inst. of Phys.* 399-403, (1994).

Bollanti, et al., "Compact Three Electrodes Excimer Laser IANUS for a POPA Optical System," *SPIE Proc.* (2206) 144-153, (1994).

Bollanti, et al., "Ianus, the three-electrode excimer laser," *App. Phys. B (Lasers & Optics)* 66(4):401-406, (1998).

Choi, et al., "A $10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Fomenkov, et al., "Characterization of a 13.5nm Source for EUV Lithography based on a Dense Plasma Focus and Lithium Emission," *Sematech Intl. Workshop on EUV Lithography* (Oct. 1999).

Hansson, et al., "Xenon liquid jet laser-plasma source for EUV lithography," Emerging Lithographic Technologies IV, *Proc. Of SPIE*, vol. 3997:729-732 (2000).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.*, 6(1): 195-198 (1988).

Lebert, et al., "Soft x-ray emission of laser-produced plasmas using a low-debris cryogenic nitrogen target," *J. App. Phys.*, 84(6):3419-3421 (1998).

Lebert, et al., "A gas discharge based radiation source for EUV-lithography," *Intl. Conf. Micro and Nano-Engineering 98* (Sep. 22-24, 1998) Leuven, Belgium.

Lebert, et al., "Investigation of pinch plasmas with plasma parameters promising ASE," *Inst. Phys. Conf.* Ser No. 125: Section 9, pp. 411-415 (1992) Schiersee, Germany.

Lebert, et al., "Comparison of laser produced and gas discharge based EUV sources for different applications," *Intl. Conf. Micro- and Nano-Engineering 98* (Sep. 22-24, 1998) Leuven, Belgium.

Lee, Ja H., "Production of dense plasmas in hypocyloidal pinch apparatus," *The Phys. Of Fluids*, 20(2):313-321 (1977).

Lewis, Ciaran L.S., "Status of Collision-Pumped X-ray Lasers," *Am Inst. Phys*. pp. 9-16 (1994).

Malmqvist, et al., "Liquid-jet target for laser-plasma soft x-ray generation," *Am. Inst. Phys.* 67(12):4150-4153 1996).

Mather, et al., "Stability of the Dense Plasma Focus," *Phys. Of Fluids*, 12(11):2343-2347 (1969).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magentized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Porter, et al., "Demonstration of Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE; Transactions on Plasma Science*, 22(6) (Dec. 1994).

Schriever, et al., "Laser-produced lithium plasma as a narrow-band extended ultraviolet radiation source for photoelectron spectroscopy," *App. Optics*, 37(7):1243-1248, (Mar. 1998).

Schriever, et al., "Narrowband laser produced extreme ultraviolet sources adapted to silicon/molybdenum multilayer optics," *J. of App. Phys.*, 83(9):4566-4571, (May 1998).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 namometers," *Laser Focus World*, p. 13. (Mar. 1997).

Wilhein, et al., "A slit grating spectrograph for quantitative soft x-ray spectroscopy," Am. Inst. Of Phys. Rev. of Sci. Instrum., 70(3):1694-1699, (Mar. 1999).

Wu, et al., "The vacuum Spark and Spherical Pinch X-ray/EUV Point Sources," *SPIE. Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

H. Kahlert et al., "High-resolution optics for thin Si-film crystallization using eximer lasers: present status and future development," *Proc. or SPIE-IS&T, Electronic Imaging, SPIE* vol. 5004 (2003), pp. 20-27.

A. Voutsas et al., "Effect of process parameters on the structural characteristics of laterally grown, laser-annealed polycrystalline silicon films," *J. of Appl. Phys.*, vol. 94, No. 12 (Dec. 15, 2003).

K. Lee, "A study on laser annealed polycrystalline silicon thin film transistors (TFTs) with SiNx gate insulator," Chapter 4, Experimental Details, http://tftlcd.kyunghee.ac.kr/research/poly-Si/chapter4.html.

J.J. Ewing et al., *Phys. Rev.* A12, 129 (1975).

M. Hoffman et al., *Appl. Phys. Lett.* 9, 538 (1976).

K. Lee, "A study on laser annealed polycrystalline silicon thin film transistors (TFTs) with SiNx gate insulator," Chapter 5, Electrical and Structural Properties of ELA Poly-Si Films, http://tftlcd.khu.ac.kr/research/poly-Si/chapter5.html.

C. Kim et al., "Excimer-laser crystallized poly-si TFT's with transparent gate", *IEEE Transactions on Electron Devices*, vol. 43, No. 4 (Apr. 1996), p. 576-579.

K. Sera et al., "High-performance TFT's fabricated by XeCl excimer laser annealing of hydrogenated amorphous-silicon film," *IEEE Transactions on Electron Devices*, vol. 36, Np. 12, (1989), pp. 2868-2872.

Y. Morita et al., "UV pulsed laser annealing of Si implanted silicon film and low-temperature super thin-film transistors," *Jpn. J. Appl. Phys.*, vol. 28, No. 2 (1989) pp. L309-L311.

K. Shimizu et al., "On-Chip bottom gate polysilicon and amorphous silicon thin-film transistors using excimer laser annealed silicon nitride gate," *Jpn. J. Appl. Phys.*, vol. 29, No. 10 (1990), pp. L1775-L1777.

M. Furuta, et al., "Bottom-gate poly-si thin film transistors using XeCl excimer laser annealing an dion doping techniques," *IEEE Trans. Electron Devices*, vol. 40, No. 14 (1993) pp. 1964-1969.

Y. Sun et al., "Excimer laser annealing process for polysilicon TFT AMLCD application," *Record of 1994 Int. Disp. Res. Conf.* (1994), pp. 134-147 (this reference not available).

mstnews Feb. 2003, http://www.suss-microoptics.com/downloads/Publications/Miniaturization_of_Imaging_Systems.pdf.

Y. Ozaki et al., Cylindrical fly's eye lens for intensity redistribution of an excimer laser beam, *Applied Optics*, vol. 28, Issue 1 (Jan. 1989) p. 106.

B. Crowther et al., "A fly's eye condenser system for uniform illumination," *Proc. of SPIE*, International Optical Design Conference 2002, vol. 4832 (2002), pp. 4832-4835.

Burnett, Levine, Shirley & Bruning, "Symmetry of spatial-dispersion-induced birefringence and its implications of CaF2 ultraviolet optics," *J. Microlith., Microsyst.*, (Oct. 2002).

Yres, J., et al., "Low Temperature Poly-Si for Liquid Crystal Display Addressing," Philips Research Laboratories, Surrey, England, (May 11, 1993); http://www.atip.org/ATIP/public/atip.reports.93/mita-lcd.93.html.

Wexler, et al., "Use of XeCl Amplifiers for Degenerate Four Wave Mixing", *American Institute of Physics, Excimer Lasers*—1983, C. Rhodes, et al. Editors, pp. 165-171, (1983).

Voutsas, A.T., "A New Era of Crystallization: Advances in Polysilicon Crystallization and Crystal Engineering," *Applied Surface Science*, 208-209 (2003) pp. 250-262.

Kudo, et al., "Advanced Lateral Crystal Growth of a Si Thin Films by Double-Pulsed Irradiation of All Solid-State Lasers," *Mat. Res. Soc. Symp. Proc.*, vol. 762, pp. A16.5.1-A16.5.6, (2003).

Dassow, et al., "YVO4 Laser Crystallization for Thin Film Transistors with a High Mobility," *Mat. Res. Soc. Symp. Proc.* vol. 621, pp. 9.3.1-9.3.6, (2000).

McKee, et al., "Operating and Beam Characteristics, Including Spectral Narrowing, of a TEA Rare-Gas Halide Excimer Laser," *IEEE J Quantum Electronics*, vol. QE-15, No. 5, pp. 332-334, (May 1979).

\* cited by examiner

*Primary Examiner*—Minsun O. Harvey
*Assistant Examiner*—Dung T. Nguyen
(74) *Attorney, Agent, or Firm*—William C. Cray

(57) ABSTRACT

An apparatus and method are disclosed for operating a narrow band short pulse duration gas discharge laser output light pulse beam producing system, producing a beam comprising laser output light pulses at a selected pulse repetition rate, which may comprise: a dispersive center wavelength selection optic selecting at least one center wavelength for each pulse determined at least in part by the angle of incidence of the laser light pulse beam containing the respective pulse on the dispersive wavelength selection optic; a tuning mechanism operative to select at least one angle of incidence of a first spatially defined portion of the laser light pulse beam containing the respective pulse upon the dispersive center wavelength selection optic; and, the tuning mechanism comprising a variably refractive optical element defining a plurality of refractive angular displacements of the first spatially defined portion of the laser light pulse beam passing through the variably refractive optical element at one of a plurality of positions of incidence of the laser light pulse beam on the variably refractive optical element. The variably refractive optical element may comprise: a first generally flat face defining a surface of incidence for the laser light pulse beam; and, a second multi-faceted or curved face defining a plurality of generally flat surfaces of exit or a continuously varying surface of exit for the laser light beam. Other aspects of pulse parameter metrology and pulse modulation control, including in response to signals from the utilization tool are disclosed, e.g., relating to proper dose control with differing center wavelength spectra.

109 Claims, 11 Drawing Sheets

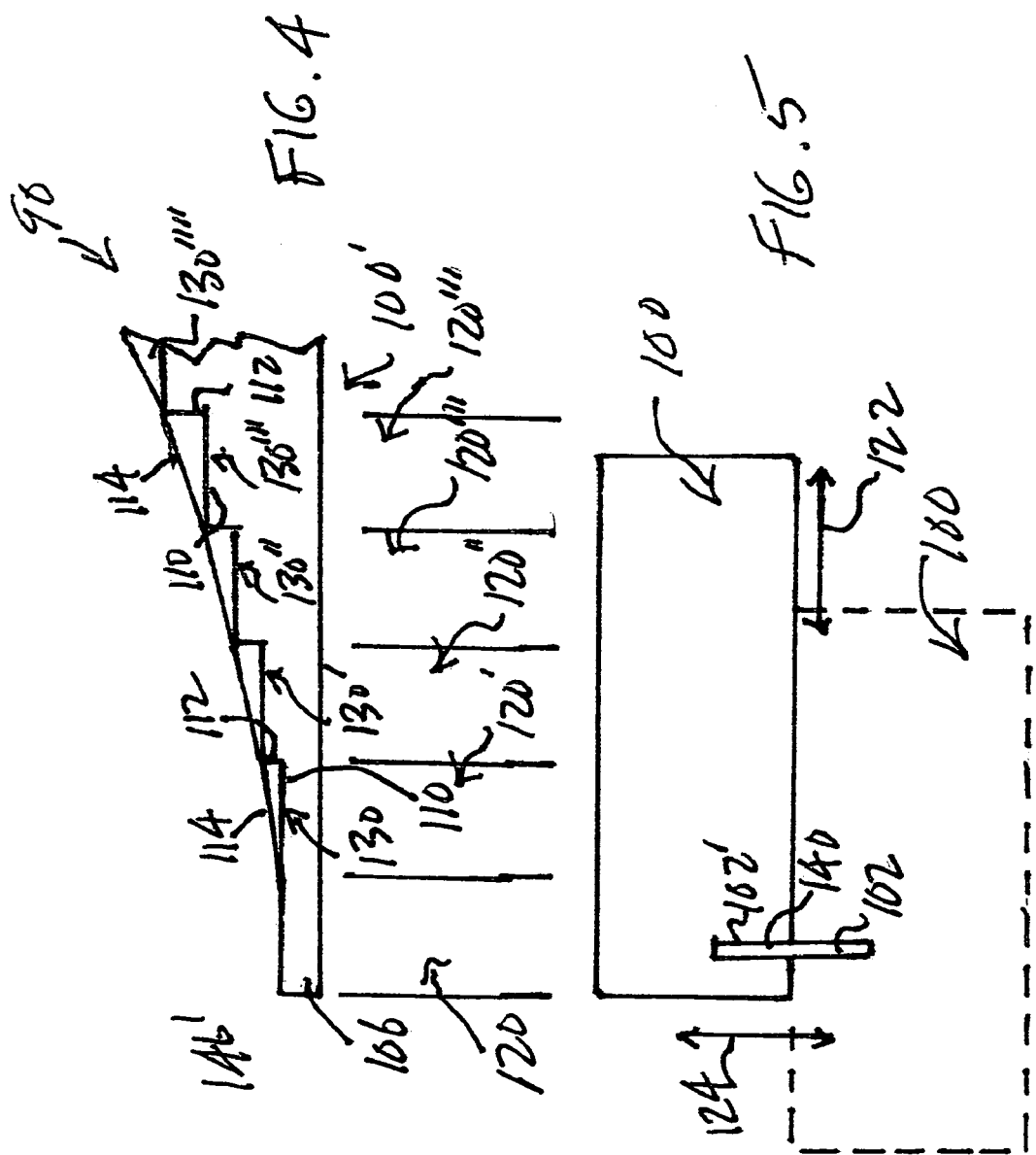

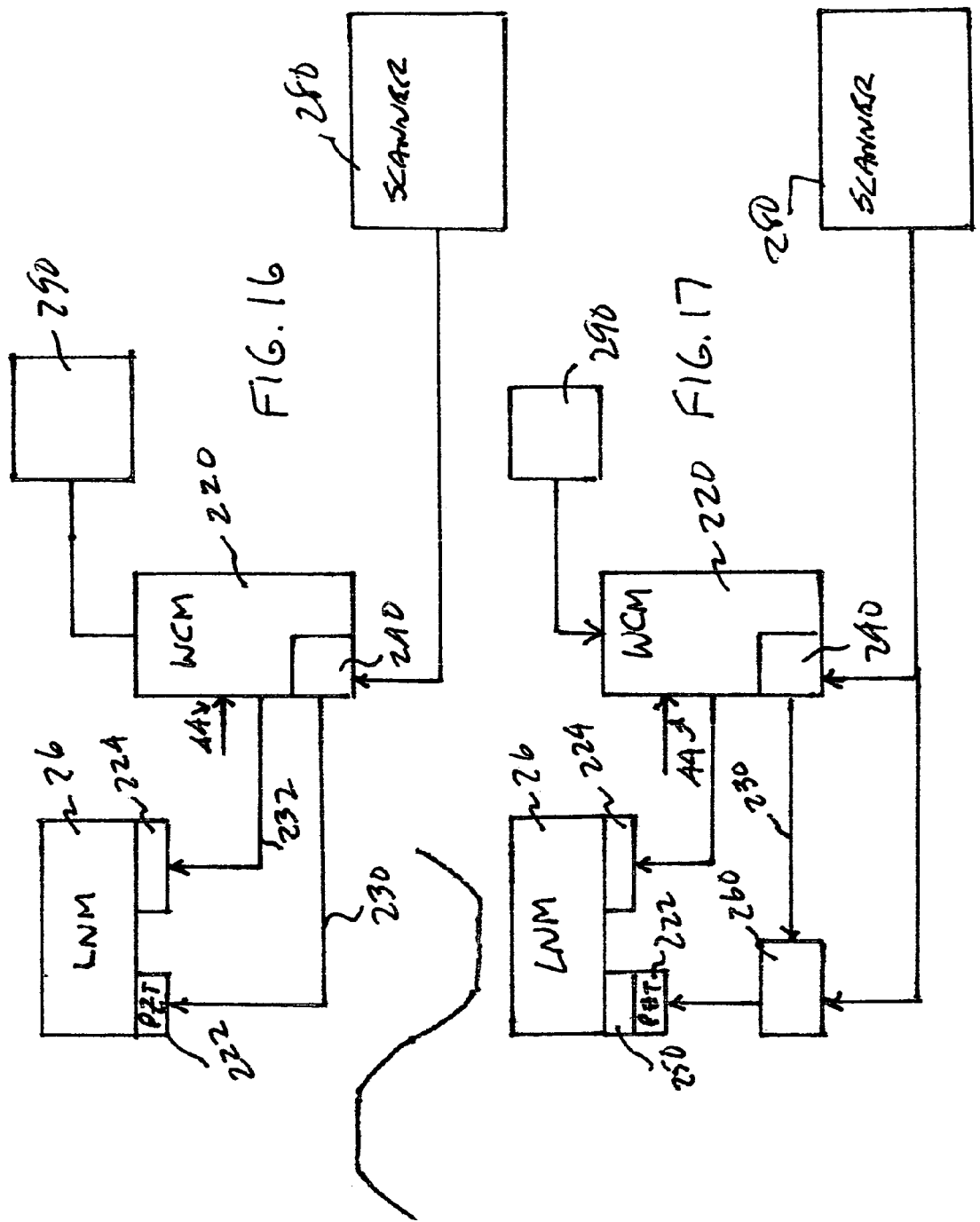

RELAX GAS DISCHARGE LASER LITHOGRAPHY LIGHT SOURCE

RELATED APPLICATIONS

The present application is a continuation-in-part of co-pending application Ser. No. 10/701,280, filed on Nov. 3, 2003, entitled LASER SPECTRAL ENGINEERING FOR LITHOGRAPHIC PROCESS, which is a continuation of Ser. No. 09/918,773, Jul. 27, 2001, also entitled LASER SPECTRAL ENGINEERING FOR LITHOGRAPHIC PROCESS, now U.S. Pat. No. 6,671,294, and the present application is a continuation-in-part of Ser. No. 10/875,662, filed on Jun. 23, 2004, entitled LASER OUTPUT BEAM WAVEFRONT SPLITTER FOR BANDWIDTH SPECTRUM CONTROL, and is a continuation-in-part of Ser. No. 10/847,799, filed on May 18, 2004, entitled LASER OUTPUT LIGHT PULSE STRETCHER, and of Ser. No. 10/808,157, filed on Mar. 23, 2004, entitled DUV LIGHT SOURCE. OPTICAL ELEMENT IMPROVEMENTS, which is a continuation-in-part of Ser. No. 10/173,190, filed on Jun. 14, 2002, entitled GAS DISCHARGE ULTRAVIOLET WAVEMETER WITH ENHANCED ILLUMINATION, now U.S. Pat. No. 6,750,972, and the present application is a continuation-in-part of Ser. No. 10/173,190, filed on Jun. 14, 2002, entitled GAS DISCHARGE ULTRAVIOLET WAVEMETER WITH ENHANCED ILLUMINATION, now U.S. Pat. No. 6,750,972, and the present application is a continuation-in-part of Ser. No. 10/884,101, filed on Jul. 1, 2004, entitled LASER THIN FILM POLY-SILICON ANNEALING OPTICAL SYSTEM, and is related to application Ser. No. 10/915,517, filed on Aug. 9, 2004, also entitled LASER SPECTRAL ENGINEERING FOR LITHOGRAPHIC PROCESS, and Ser. No. 10/912,933, filed on Aug. 5, 2004, also entitled LASER SPECTRAL ENGINEERING FOR LITHOGRAPHIC PROCESS, the former of which is an continuation of and the latter of which is a divisional of Ser. No. 10/036,925, filed on Dec. 21, 2001, Ser. No. 10/881,533 filed on Jun. 29, 2004, entitled METHOD AND APPARATUS FOR GAS DISCHARGE LASER OUTPUT LIGHT COHERENCY REDUCTION, and Ser. No. 10/712,545, filed on Nov. 13, 2003, entitled, LONG DELAY AND HIGH TIS PULSE STRETCHER, and Ser. No. 10/676,224, filed on Sep. 30, 2003, entitled OPTICAL MOUNTINGS FOR GAS DISCHARGE MOPA LASER SPECTRAL ANALYSIS MODULE, and Ser. No. 10/676,175, filed on Sep. 30, 2003, entitled GAS DISCHARGE MOPA LASER SPECTRAL ANALYSIS MODULE, each of the foregoing being assigned to the common assignee of the present application and the disclosures of each of which being hereby incorporated by reference.

FIELD OF THE INVENTION

The present invention relates to laser light delivery systems, e.g., gas discharge laser light delivery systems that deliver light to applications using the light, e.g., integrated circuit wafer manufacturing exposure tools and thin film transistor amorphous silicon annealing tools and like tools with specially engineered spectra, e.g., discrete or essentially discrete separate peaks either in every pulse in a burst of pulses or essentially every pulse in a burst of pulses, e.g., every other pulse or the like, or as an integrated effect over the burst of pulses, e.g., by varying center wavelengths and or the separation of the peaks or the central wavelength between the peaks or the like to effect certain beneficial results at the workpiece, e.g., improved depth of focus.

BACKGROUND OF THE INVENTION

It is well known in the art of semiconductor manufacturing that depth of focus ("DOF") is an important issue. Fukuda (Hitachi Central Research Labs) proposed a method to increase DOF using FLEX (Focus Latitude Enhanced eXposure) in 1989, wherein the exposure is performed using two stage focal positions. This is discussed in U.S. Pat. No. 4,869,999, entitled METHOD OF FORMING PATTERN AND PROJECTION ALIGNER FOR CARRYING OUT THE SAME, issued to Fukuda, et al on Sep. 26, 1989 ("Fukuda I"), where the specification also notes that:

It has been found by the inventors' investigation that the effective focal depth of an exposure optical system can be increased by overlapping a plurality of light beams having image points at different positions on an optical axis, and thus the image of a mask pattern can be formed accurately in a region between the top and the bottom of the topography of a substrate surface. The term "image point" indicates a point on the conjugate plane of the mask pattern with respect to the exposure optical system. Accordingly, when an exposure operation for exposing a substrate coated with a resist layer to exposure light through a mask is performed a plurality of times at different positional relations in the direction of the optical axis between the resist layer and the image plane of a mask pattern, or when exposure operations at the different positional relations are simultaneously performed, the image of the mask pattern can be accurately formed not only at the top and the bottom of the topography of a substrate surface but also at an intermediate position between the top and the bottom of the topography. Thus, a fine pattern can be formed accurately all over the topography. (Col. 3, lines 33–54, emphasis added) Fukuda I also states:

Furthermore, in the present embodiment, the image plane of a mask pattern was formed at two different positions in (or over) the substrate by displacing the substrate in the direction of an optical axis. Alternatively, the image plane of the mask pattern may be formed at different positions by moving a reticle having a mask pattern in the direction of the optical axis, by introducing a transparent material different in refractive index from air into an exposure optical system, by changing the atmospheric pressure in the whole or a portion of the exposure optical system, by using a lens having a multiple focal point, by overlapping light beams from a plurality of exposure optical systems which form the image plane of a mask pattern in different planes, or by using different wavelengths or a continuous wavelength in the same exposure optical system. (Col. 6, lines 37–53, emphasis added) It has also been proposed, e.g., in systems sold, e.g., by Nikon, that a stepper allow continuous stage motion between two focal planes.

In U.S. Pat. No. 4,937,619, entitled PROJECTION ALIGNER AND EXPOSURE METHOD, issued to Fukuda, et al. on Jun. 26, 1990 ("Fukuda II"), there is proposed a system in which separate laser beams are generated and optically combined to produce a single beam with a plurality of different wavelengths arriving at the reticle in the lithography tool at the same time. Fukuda II also notes:

FIG. 5 is a configuration diagram of a third embodiment of the present invention. The embodiment shown in FIG. 5 comprises a reflecting mirror 31, an etalon 32, an excimer laser gas cavity 33, an output mirror 34, a mirror 35, an etalon angle control circuit 36, a laser oscillation control circuit 37, an exposure wavelength control circuit 38, an illumination optical system 14, a reticle 15, a projection lens 16, a substrate stage 17, and various elements required for the projection aligner.

The etalon 32 narrows the bandwidth of the laser beam oscillated by the excimer laser resonator composed of a reflecting mirror 31, excimer laser gas cavity 33, and an output mirror 34, and changes the central wavelength of light narrowed in bandwidth by adjusting the angle of the etalon 32 minutely. The wavelength control circuit 38 sends a command to the etalon angle control circuit 36 to set the angle of the etalon at a predetermined value, and sends a command to the laser oscillation control circuit 37 to cause laser oscillation with a predetermined number of exposure pulses for the etalon angle. The exposure wavelength control circuit 38 is capable of changing the set angle of the etalon 32 during the exposure of one exposure region located on the substrate by using the above described function and is capable of performing projection exposure by using light having a plurality of different wavelengths. Since the projection lens 16 focuses the pattern on the reticle 15 onto a different position on an identical optical axis with respect to each of the above-described plurality of wavelengths, it is possible to perform the focus latitude enhancement exposure by using the present projection aligner.

Instead of being disposed between the reflecting mirror 31 and the laser resonator 33 as shown in FIG. 5, the etalon 32 and the wavelength control means may be disposed between the output mirror 34 and the laser gas cavity 33, or between the output mirror 34 and the illumination optical system 14, for example. Further, the above described line narrowing and wavelength alteration are not restricted to the method of changing the angle of the etalon.

The present embodiment is economically advantageous because only one excimer laser is used. In addition, lowering of laser output caused by bandwidth narrowing can be limited to a small value because the bandwidth-narrowing device is disposed between the reflecting mirror and the output mirror.

By using the present projection aligner, it was confirmed that the depth of focus of fine patterns increased in the same way as the first embodiment.

In U.S. Pat. No. 5,303,002, entitled METHOD AND APPARATUS FOR ENHANCING THE FOCUS LATITUDE IN LITHOGRAPHY, issued to Yan on Apr. 12, 1994, there is proposed also combining separately generated laser beams to obtain a single beam at the reticle with a plurality of wavelengths. Yan also proposes the generation of three output beams from a single laser system, but the embodiment proposed is not workable.

In the prior applications assigned to applicant's assignee referenced above "spectral engineering" has been proposed using, e.g., a wavelength and bandwidth tuning mechanism to produce an apparent spectrum over a series of pulses in a burst of pulses output by the laser system that effectively contains a plurality of discrete spectra. The '280 patent and '773 application suggest that:

A fast responding tuning mechanism is then used to adjust center wavelength of laser pulses in a burst of pulses to achieve an integrated spectrum for the burst of pulses approximating the desired laser spectrum. The laser beam bandwidth is controlled to produce an effective beam spectrum having at least two spectral peaks in order to produce improved pattern resolution in photo resist film. . . . In a preferred embodiment, a wavelength tuning mirror is dithered at dither rates of more than 500 dithers per second in phase with the repetition rate of the laser. . . . In another embodiment, the maximum displacement was matched on a one-to-one basis with the laser pulses in order to produce a desired average spectrum with two peaks for a series of laser pulses. Other preferred embodiments utilize three separate wavelengths.

The disclosures of the foregoing issued patents are hereby incorporated by reference.

RELAX, an acronym for "Resolution Enhancement by Laser-spectrum Adjusted eXposure", according to one embodiment, is based on the concept of engineering the laser spectrum to have two (or more) peaks in order to increase depth of focus (DOF). Simulations using PROLITH software have demonstrated that a dual peak spectral shape can improve DOF two- to three-fold with acceptable sacrifice to exposure latitude, e.g., for specific configurations of contact holes and line spacing patterns. The light spectrum can contain, e.g., two spectral peaks (either simultaneously or in alternating pulses) which create two different optimal focal planes in the photoresist. This puts every part of even very thick resists (400 nm and up) within acceptable depth of focus at a given reasonable (6–12%) exposure latitude. As a result of exposure with dual peaks, the resist sidewalls maintain an acceptable angle through the resist and there is good control on critical dimensions. Fewer clogged up or underexposed contact holes deliver improved yield and increased profitability for the chipmaker. According to aspects of an embodiment of the present invention applicants have provided for a solution that provides lot-to-lot control on the peak-to-peak separation. Optimal separation can be determined through simulation using CD, illumination condition, mask information and laser spectrum. Applicants proposal also provides for the sum of the integration of the energies under the split spectra will be equal to the total integration of the energy from an initial (non-split) spectrum and peaks that can be made symmetrically separated from the central wavelength.

Specific implementations of RELAX, require modifications to existing laser light source systems, e.g., gas discharge laser light source systems, e.g., in actual implementation of wavefront splitting, metrology, synchronization with the application using the light, e.g., a wafer scanner scanning window, and like issues addressed by aspects of embodiments of the present invention.

SUMMARY OF THE INVENTION

A narrow band short pulse duration gas discharge laser output light pulse beam producing system, producing a beam comprising laser output light pulses at a selected pulse repetition rate, and method, are disclosed that may comprise: a dispersive center wavelength selection optic selecting at least one center wavelength for each pulse determined at least in part by the angle of incidence of the laser light pulse beam containing the respective pulse on the dispersive wavelength selection optic; a tuning mechanism operative to select at least one angle of incidence of a first spatially defined portion of the laser light pulse beam containing the respective pulse upon the dispersive center wavelength selection optic; and, the tuning mechanism comprising a variably refractive optical element defining a plurality of refractive angular displacements of the first spatially defined portion of the laser light pulse beam passing through the variably refractive optical element at one of a plurality of positions of incidence of the laser light pulse beam on the variably refractive optical element. The appparatus and method may further comprise the variably refractive optical element comprising: a first generally flat face defining a surface of incidence for the laser light pulse beam; and, a second multifaceted face defining a plurality of generally flat surfaces of exit for the laser light beam, each surface of exit defining a unique and discrete angle of exit from the variably refractive optical element, or a second generally cylindrical face defining a plurality of curved exit surfaces for the laser light beam, each exit surface approximating a unique and discrete flat surface of exit for the laser light pulse beam each such curved surface of exit approximating a unique and discrete angle of exist continuously increasing or decreasing along a longitudinal extent of the variably refractive optical element. The apparatus and method may further comprise a translating mechanism translating the variably refractive optical element in relation to the laser light pulse beam generally parallel to a first axis of the beam profile and in a direction generally aligned with the longitudinal extent of the variably refractive optical element or in a direction generally orthogonal to the longitudinal extent of the variably refractive optical element or both. There may be a second tuning mechanism intermediate the dispersive wavelength selection element and the variably refractive optical element which may comprise a tuning mirror defining an angle of incidence between the laser light pulse beam and the dispersive wavelength selective element, which may be positioned to define the angle of incidence by a combination of an electromechanical course positioning mechanism and a fine positioning mechanism comprising a material whose properties are altered by the application of an electrical field to the material, which may be a piezoelectric material. The tuning mechanism may be operative to select a first angle of incidence for at least a first plurality of pulses within the temporal scan period and a second angle of incidence for at least a second plurality of pulses within the temporal scan period, the sum of the at least a first plurality of pulses and the at least a second plurality of pulses equaling N pulses, and the at least a first plurality of pulses may comprise sequential pulses for which the first angle of incidence is selected and the at least a second plurality of pulses may comprise sequential pulses for which the second angle of incidence is selected. There may also be at least one transition pulse intermediate each one of the at least a first plurality of pluses and each one of the at least a second plurality of pulses, with the at least one transition pulse being one for which the laser is not fired, with the total number of the first plurality of pulses and the second plurality of pulses and transition pulses equaling N pulses. The at least one first and second transition pulses each may comprise a plurality of first and second transition pulses. The method may comprise producing a narrow band short pulse duration gas discharge laser output light pulse beam comprising bursts of a selected number of laser output light pulses at a selected pulse repetition rate, for utilization in a light utilizing tool having a temporal scan period lasting for a selected number, N, of pulses in the burst of pulses, where N may be an even integer, by utilizing a dispersive wavelength selection optic selecting a center wavelength for each pulse determined at least in part by the angle of incidence of the laser light pulse beam containing the respective pulse on the dispersive wavelength selection optic; utilizing a tuning mechanism to select a first angle of incidence for a plurality of pulses within the temporal scan period and a second angle of incidence for a second plurality of pulses within the temporal scan period, with the total number of pulses at the first angle of incidence and at the second angle of incidence and transition pulses equaling N pulses or may comprise dividing the number of pulses in the burst into at least one exposure period comprising a portion of the burst of pulses, comprising at least two portions comprising at least a first portion and at least a second portion; providing a plurality of pulses at a first center wavelength during the first portion and at a second wavelength during the second portion; not providing at least one pulse intermediate the first portion and the second portion and also intermediate any pulses prior to the first portion and the first portion or after the second portion and the second portion, within the exposure window; repeating the above steps for each exposure period within a burst of pulses. The method may further comprise controlling the dose per pulse in the pulses in the first portion separately from one another and separately from the dose per pulse in the second portion and controlling the dose per pulse in the pulses in the second portion separately from one another and separately from the pulses in the first portion and may comprise controlling the cumulative dose for the pulses in the first portion to be the same as the cumulative dose for the pulses in the second portion. The apparatus and method may comprise the laser output light pulse beam comprising a plurality of center wavelength spectra within spatially separate but not temporally separate portions of the laser output light pulse beam; a laser output light pulse beam parameter metrology module; and a beam homogenizer in the path between the beam producing system and the beam parameter metrology module. The apparatus and method may further comprise the laser output light pulse beam comprising a plurality of center wavelength spectra within spatially separate but not temporally separate portions of the laser output light pulse beam; a laser output light pulse beam parameter metrology module; a beam homogenizer within the beam parameter metrology module within the optical path to at least one beam parameter measuring instrument and the measuring instrument may be a power meter. The apparatus and method may further comprise a partial spatial beam blocker within the metrology module within the optical path to at least one beam parameter measuring instrument, which may be a power meter, a center wavelength detector and/or a bandwidth detector. The apparatus and method may further comprise the laser output light pulse beam comprising a plurality of center wavelength spectra within spatially separate but not temporally separate portions of the laser output light pulse beam; a laser output light pulse beam parameter metrology module; a beam power meter within the beam parameter metrology module measuring the respective power contained in each respective spatially separate but not temporally separate portion of the laser output light pulse beam pulses and the sum of the respective powers contained in each respective spatially separate but not temporally separate portion of each laser output light pulse beam pulse. There may also be a beam parameter control module responsive to an output of the beam parameter metrology module controlling a beam parameter measured by the metrology module responsive to the output of the beam metrology module in feedback control, which may be responsive to an output from the utilization tool controlling a beam parameter in feedback control, responsive to an output from the utilization tool and an output from the beam parameter metrology module controlling a beam parameter in feedback control. The apparatus and method may further comprise The laser output light pulse beam comprising a plurality pulses having a first center wavelength and a plurality of pulses having a second center wavelength separated by a selected difference in the respective center wavelengths; a laser output light pulse beam parameter metrology module; a laser controller; a wavelength controller controlling the respective center wavelengths and the difference in center wavelengths in response to at least one signal from the beam parameter metrology module and at least one signal from the laser controller, with the wavelength controller controlling the respective center wavelengths and the difference in center wavelengths in response to at least one signal from the utilizing tool, which also may comprise a signal taken from the group of signals representative of the number of pulses in a scan window, a desired set of center wavelengths, a desired peak to peak separation and a desired central wavelength and with the wavelength controller selecting a periodic center wavelength modulation signal and the period of the periodic center wavelength modulation signal being based upon the number of pulses in the scan window. The wavelength modulation signal may comprise a plurality of successive pulses of a first center wavelength and a plurality of successive pulses of a second center wavelength and a plurality of at least one transition pulse intermediate the plurality of successive pulses of the first center wavelength and the plurality of successive pulses of the second center wavelength at each transition from the plurality of pulses at the first center wavelength to the plurality of pulses of the second center wavelength, wherein for each transition pulse the laser is not fired. The wavelength modulation signal may comprise a slow sinusoidal signal with a period determined by the period of the scan window, or a fast sinusoidal signal with a frequency determined by a fraction of the pulse repetition rate of the laser. The wavelength modulation signal may comprise a rounded square wave with a period determined by the period of the scan window. The apparatus and method may also comprise a dose controller controlling dose separately for the pulses of the first center wavelength and the pulses of the second center wavelength, and/or for the longer wavelength portion of the sinusoidal modulation signal and the shorter wavelength portion of the sinusoidal modulation signal, and/or for the longer wavelength pulses generated by the rounded square wave and the shorter wavelength pulses generated by the rounded square wave.

BRIEF DESCRIPTION OF THE DRAWINGS

FIG. 4 shows schematically another embodiment of a variably refractive optical element according to aspects of an embodiment of the present invention;

FIG. 5 shows schematically the utilization of two variably refractive optical elements to create a RELAX multi-peaked spectrum according to aspects of an embodiment of the present invention;

FIG. 16 shows schematically a controller for implementing a modulation scheme according to aspects of an embodiment of the present invention;

FIG. 17 shows schematically a controller for implementing a modulation scheme according to aspects of an embodiment of the present invention;

DETAILED DESCRIPTION OF PREFERRED EMBODIMENTS

Figure 1:
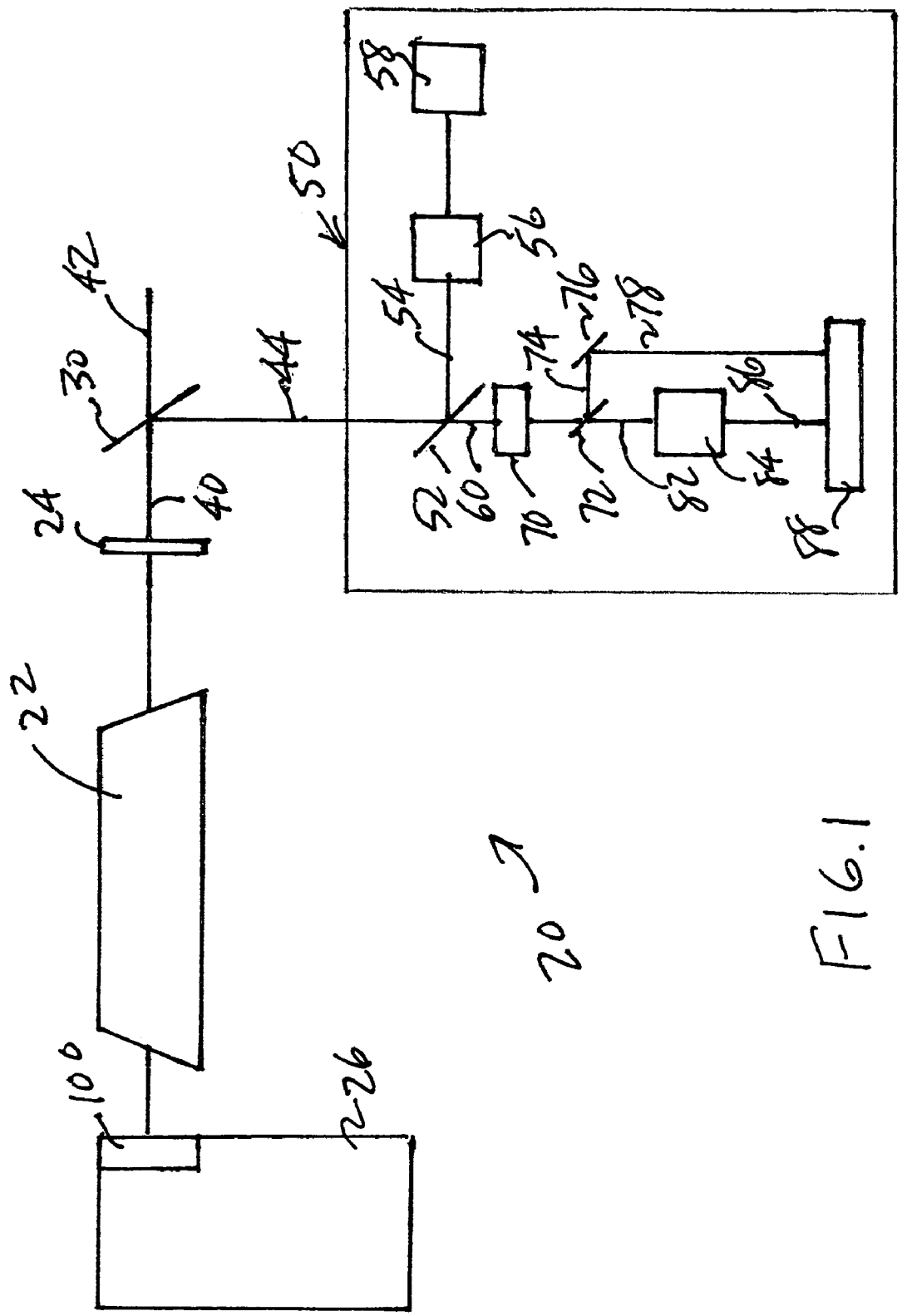
FIG. 1 schematically in block diagram form a RELAX laser light source system according to aspects of an embodiment of the present invention.

Turning now to FIG. 1 there is shown a RELAX laser output light pulse producing system 20 which may comprise, e.g., a laser chamber 22, an output coupler 24 and a line narrowing module 26, together forming a resonant laser oscillator. An output laser light pulse beam 40 comprising pulses in bursts of pulses, e.g., several hundred pulses per burst, at a selected pulse repetition rate and pulse energy. Such a beam of pulses may be passed through a beam splitter 30, which may serve to reflect a small portion of the output laser light pulse beam comprising a diagnostic laser light pulse beam 44, e.g., about 5%, into a metrology package 50, with the remainder forming a laser system 20 laser output light pulse beam 42. Within the metrology package, a further beam splitter 52 may serve to split the beam 44 into a portion 54 that enters a homogenizer 56 followed by a power meter 58. The unreflected portion 60 of beam 44 passing through the beam splitter 52 is passed through a beam winker 60, which may be, e.g., a shutter alternately blocking different spatial portions of the beam in beam profile/cross-section, and then partially reflected in a second beam splitter 72, with a reflected beam portion 74 reflecting off of a mirror 76 to form a course wavelength measurement beam 78 incident on a photo-diode array ("PDA") 88. It will be understood, as is well known in the art that the beam 74 is also incident on a grating (not shown) before illuminating the portion of the PDA 88 upon which it is incident. The beam 82 passed through the beam splitter 72 is incident on an etalon 84, which serves to produce a fringe pattern incident on a portion of the PDA 88 for the purpose of fine determination of the wavelength of the light in the beam 86 exiting the etalon 84.

Figure 9:
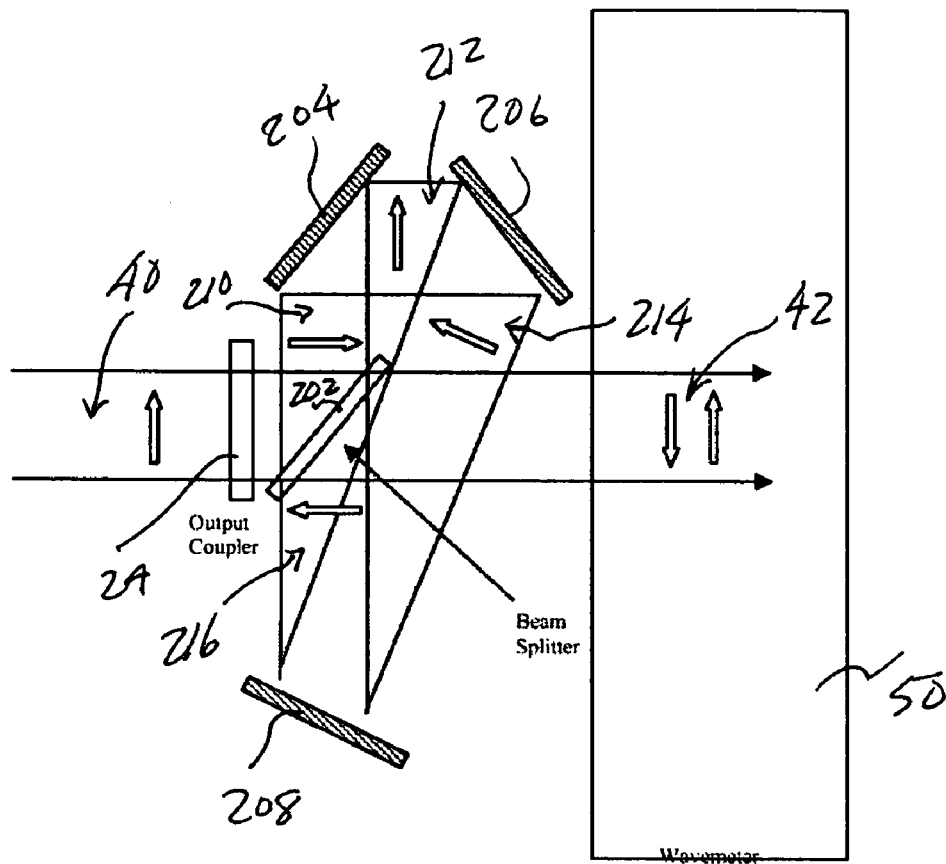
FIG. 9 shows schematically a beam homogenizer according to aspects of an embodiment of the present invention.

Turning now to FIG. 9 there is shown a beam homogenizer 200 which may be used according to aspects of an embodiment of the present invention. The homogenizer 200 may be placed after the output coupler 24 of a resonant oscillator cavity as discussed above, or may also, e.g., be placed after an output window, e.g., for a power amplifier in, e.g., a master oscillator-power amplifier ("MOPA") configured laser system. It will be understood that as used herein, "laser" is broad enough to cover a single resonant cavity laser system or a system such as a MOPA configured system having, e.g., an oscillator section, e.g., a master oscillator ("MO") feeding an amplifier system for amplifying the output of the oscillator section, e.g., a power amplifier ("PA") and other forms of such systems, e.g., POPO, MOPO, and POPA laser systems, with the output laser light pulses in the output laser light pulse beam produced by such laser systems being the same for purposes of interpreting the present Specification and appended claims unless indicated clearly otherwise herein.

The homogenizer 200 may comprise a beam splitter 202 that comprises a partially reflecting mirror 202, e.g., with reflective coatings for the operating wavelength that reflects about 40–60% of the laser output beam 40 to a maximally reflecting mirror 204, and passes about 60–40% of the beam 40 as part of output beam 42. The maximally reflecting mirror 204 then reflects the beam 210 to another maximally reflecting mirror 206, which reflects the beam 212 to a third maximally reflecting mirror 208, as beam 214, which then reflects the beam 214 as beam 216 onto the reverse side of the beam splitter 202, which then partially reflects, e.g., about 40–60% of the beam as part of output beam 42. The output beam 42 may pass through a wavemeter metrology package 50, where a small portion is separated from the output beam 42 as described above.

The mirrors 202, 204, 206 and 208 are aligned to reflect the beam through the optical delay path of the beams 210, 212, 214 and 216 and at the same time folding the beam upon itself such that the output beam 42, as indicated by the arrows in FIG. 9, has a component portion passed through the beam splitter 202 and a component pass through the optical delay path and also folded upon itself in the optical delay path. The delay path need not be of a length that causes any significant temporal stretching of the laser output light pulses in the laser output light pulse beam 40 into beam 42, but, rather the optical delay path serves mostly as a beam homogenizer.

Figure 2:
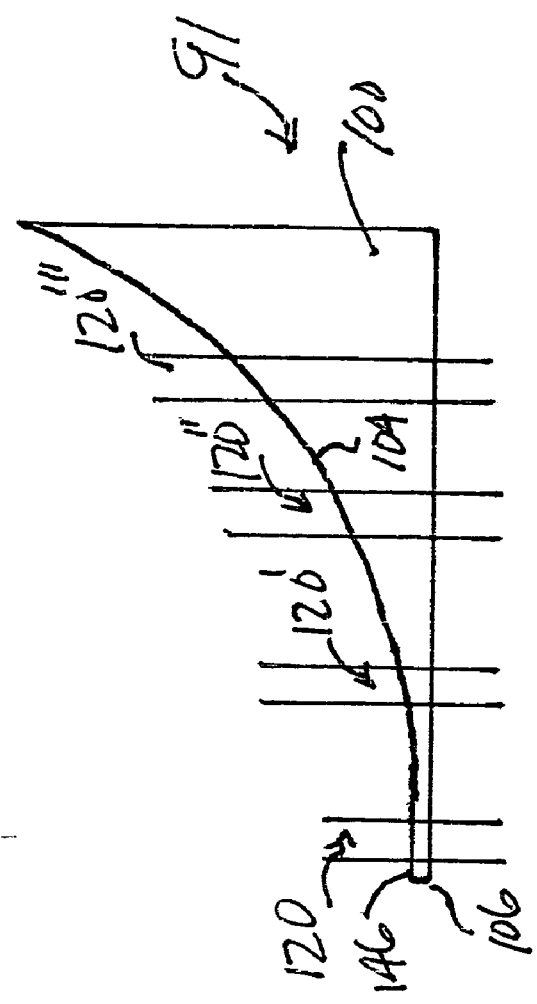
FIG. 2 shows schematically an insertable variably refractive optical element according to aspects of an embodiment of the present invention.

Turning now to FIGS. 2–5 there is shown a RELAX arrangement for a narrow band short pulse duration gas discharge laser output light pulse beam producing system, producing a beam comprising laser output light pulses at a selected pulse repetition rate, comprising a dispersive center wavelength selection optic (not shown) selecting at least one center wavelength for each pulse determined at least in part by the angle of incidence of the laser light pulse beam containing the respective pulse on the dispersive wavelength selection optic; a tuning mechanism 91 operative to select at least one angle of incidence of a first spatially defined portion of the a laser light pulse beam (e.g., 102' shown in FIG. 5) containing the respective pulse upon the dispersive center wavelength selection optic; and, the tuning mechanism 91 comprising a variably refractive optical element 100 defining a plurality of refractive angular displacements for the first spatially defined portions of the laser light pulse beam (e.g., 130, 130', 130", 130''' and 130'''' shown in FIG. 4) each passing through the variably refractive optical element 91 at one of a plurality of positions of incidence of the laser light pulse beam on the variably refractive optical element (e.g., 120, 120', 120", 120''' as shown in FIGS. 2 and 4).

It will be understood by those skilled in the art that the homogenization of the beam 40 may occur for purposes of facilitating metrology, only in the portion 44 of the beam directed into the metrology module 50, e.g., in homogenizer 56, or these may also be additional homogenization, e.g., if the homogenizer 200 according to FIG. 9 is utilized. The homogenizer 56 may be similar in design to that of FIG. 9, but may also include optical elements such as conjoined dove prisms, right angle and isosceles prisms such as discussed in the copending application entitled METHOD AND APPARATUS FOR GAS DISCHARGE LASER OUTPUT LIGHT COHERENCY REDUCTION, discussed above. In this fashion, the power meter may be illuminated with a homogenized beam and the power may be an integration of the power at each of the plurality of center wavelengths contained in spatially separate but not temporally separate portions of the beam.

Alternatively, several power meters may be used, and/or the beam, e.g., passed through a shuttering system 60, e.g., in the event that the two or more center wavelengths are generated in the laser system in a manner in which they are spatially separated in the beam, such that one half of the beam is sampled in one power meter and another half in a second power meter, e.g., for a twin peak spectrum. Similarly the shuttering (beam winking) may be used to illuminate one power meter with alternating portions of the beam.

In addition the entire beam may also be used to illuminate a power meter, either homogenized or not. In this fashion the metrology system may measure the power (dose) of the one spectrum and the other spectrum and the total, and, e.g., the one (a) and the second (b) and the total (T) may be used, e.g., to divide up the dose energy between spectral peaks, e.g., according to the formula a/T and b/T. Similarly the division of the dose may be determined by the formulas a/(a+b) and b/(a+b). Where the separate peaks are in distinct pulses, e.g., in a burst of pulses, the dose for a burst may similarly be determined without modification to current metrology tools, e.g., by summing the dose for pulses of the separate wavelengths, e.g., in a twin peak integrated spectrum, summing all of the $\lambda_1$ pulses and all of the $\lambda_2$ pulses, for a total $\lambda_1$ dose and a total $\lambda_2$ dose and summing the two for a total dose. In this event, dose stability may also be determined separately for the $\lambda_1$ and $\lambda_2$ pulses, e.g., for computing separate or combined total dose and dose stabilities, e.g., pulse to pulse within each of the pulses of the same center wavelength.

As noted below, for certain RELAX configurations according to aspects of an embodiment of the present invention, this may require, e.g., summing and averaging doses for, e.g., $\lambda_1$ pulses, and $\lambda_2$ pulses, either or both of which may comprises pulses separated from each other temporally within a burst of pulses, e.g., in two or more different groups of pulses, which may or may not be entirely adjacent pulses and separated also by a transition pulse(s) between the groups of pulses. This can require, e.g., that traditional ways of determining dose and dose sigma be modified to accommodate the multiple peaks within a RELAX burst of pulses having a separate and discrete center wavelength within each pulse in the different groups of pulses and an intermediate transition pulse(s), and their positioning within the burst and with respect to, e.g., a scan window. Also as noted below, the relationship of the scan window to the arrangement(s) of the groups of RELAX spectrum pulses of different wavelength from group to group and the total number of pulses of the different wavelengths and the total number of pulses including the transition pulses is also a critical factor.

Currently existing control algorithms may be used to control, e.g., the $V_{cp}$ peaking capacitor voltage in the solid state pulse power module to control dose, pulse to pulse, by using the detected power for, e.g., the $\lambda_1$ pulses for their respective gas discharges and for the $\lambda_2$ pulses for their respective gas discharge.

The metrology module 50 may also include a shuttering device 60 to block a portion of the beam containing a specific center wavelength or center wavelengths so that, e.g., only a single portion of the beam 44 that contains only or mostly only a single center wavelength spectrum is projected onto the fringe pattern generating mechanism, e.g., the etalon 84. In this regard it may be important, e.g., to account for any movement in the split in the spatial distribution of the center wavelengths, e.g., the split in the middle of the beam or roughly in the middle of the beam for a twin peak spectrum having both peaks in the beam at all times as opposed to changing in different pulses. In this case, any shuttering or other optical or mechanical blocking mechanism utilized should block off slightly more than half of the beam, consistent with having enough illumination for the PDA to work properly, such that any tolerance in the drifting up or down of the split between wavelength portions can be accommodated. That is, less that the entire half of the beam is sampled, in this example of two halves each with a separate center wavelength, with the loss of some photons, but with more assurance that the sampled half is all of the same center wavelength. To the same effect the sampled portion may be some other selected portion according to the number of spectral peaks spatially separated but not temporally separated within the beam. The sampling may be done by moving the shutter 60, pulse-to-pulse, or alternatively, alternating between positions to integrate over several selected spatial portions in successive pulses having one center wavelength in that portion and blocking those spatial portions having a different center wavelength in intervening pulses.

No matter how the individual wavelengths are determined, the wavelength control module will provide feedback in the form of the value for each center wavelength, e.g., $\lambda_1$ and $\lambda_2$, the peak separation, i.e., $\lambda_2-\lambda_1$ and the central wavelength or center of gravity of the integrated spectrum, i.e., $(\lambda_1+\lambda_2)/2$. In the case of, e.g., three center wavelengths these values may be, e.g., $\lambda_1$, $\lambda_2$ and $\lambda_3$, $\lambda_3-\lambda_1$ and $\lambda_3-\lambda_2$, with the value for $\lambda_2$ being the central wavelength or center of gravity of the integrated three peak spectrum, assuming even spacing between peaks.

Figure 3:
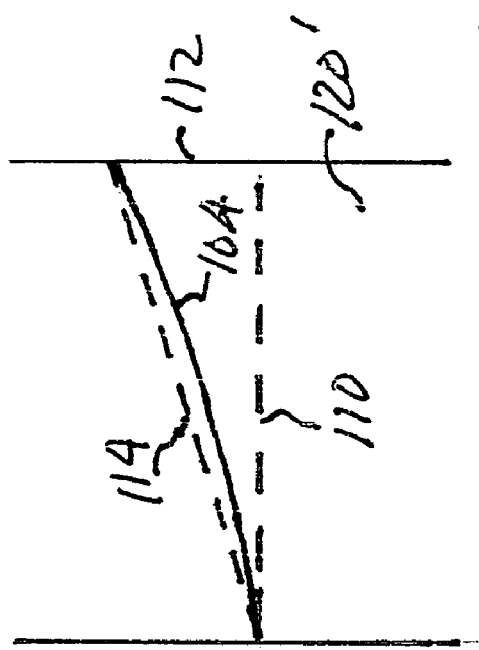
FIG. 3 is a more detailed view of a portion f the optical element shown in FIG. 2.

Turning now to FIG. 3 there is shown how a cylindrical concave lens 100 according to aspects of an embodiment of the present invention approximates the multiple discrete wedge variable refractive element 100' of FIG. 4. As shown in FIG. 3 the curved surface of exit 104 of the optical element 100 at any portion along its curved surface approximates a wedge with sides 110, 112 and an hypotenuse 114, for a given beam passing through a beam passage 102' which defines the location and size of the approximated wedge portion of the curved concave cylindrical lens surface 114, and thus the average deflection of the beam passing through passage 102' and the resultant average center wavelength. Thus for a selected radius of curvature and a beam width of, e.g., about 5 mm, in the short axis of the beam profile, the variation in center wavelength selection across the beam width due to the curvature of the surface 104 can be determined, and, e.g., may be around 0.5 pm.

It will also be understood by those in the art that, as shown in FIG. 5 there may be two variably refractive optical elements, on for a top half 102' of the beam 140 and one for the bottom half 102 of the beam 140, which may be inserted in the path of the beam 140 to differing degrees, as illustrated schematically in FIG. 5 by the position of the dashed line second optical element 100, such that, e.g., the top half 102' of the beam 140 is passing through a position of incidence 120 and the bottom half through a position of incidence 120''', each with a different effective refraction of the respective half of the beam, to arrive at spatially separated parts of the beam 140 each with a different effective center wavelength. Effective center wavelength being that center wavelength resulting from passage through the optical element 100, 100' at a given position with whatever variation results in the center wavelength due to, e.g., the surface of exit in the embodiment of FIG. 4 being unevenly flat or the beam 140 passage, e.g., being other than coincident with the flat surface of exit, i.e., overlapping partly into an adjacent surface of exit, all the way up to the surface of exit being curved intentionally as in the embodiment of FIG. 2.

It will also be understood that the variably refractive optical elements 100, 100' may have an end portion 146, 146' that is flat on the exit surface, so that when inserted in the path of the beam, the bean is not refracted. It will be understood by those skilled in the art, as discussed above, that according to aspects of an embodiment of the present invention the variably refractive optical element 100, 100' may also have a translating mechanism (not shown) for translating the variably refractive optical element(s) 100, 100' in relation to the laser light pulse beam generally parallel to a short axis of the beam in profile and in a direction 122 as shown in FIG. 5 generally aligned with the longitudinal extent of the variably refractive optical element(s) 100, 100' along the longitudinal axis of the element 100, 100'. In this manner the refraction of the beam 140 by either or both of the optical elements 100, 100' may be selected. It will be understood, as noted above, that one or both of the optical elements 100,. 100' may have the beam 140 pass through a flat portion 146, 146' or be eliminated altogether, thus having at least one portion 102, 102' of the beam 140 not be refracted.

It will also be understood by those skilled in the art that the optical element(s) 100, 100', whether there be only one in the beam path or a plurality in the beam path, may be translated by a translating mechanism (not shown) translating the variably refractive optical element(s) 100, 100' in relation to the laser light pulse beam 140 generally parallel to a long axis of the beam in profile and in a direction 124 as shown in FIG. 5, generally orthogonal to the direction 122 of the longitudinal extent of the variably refractive optical element(s). In this manner, according to aspects of an embodiment of the present invention the amount of energy in the portions 102, 102' of the beam 140 at each respective selected center wavelength for that respective spatial portion of the beam 140 may be selected. This may be selected to intentionally balance or imbalance the amount of energy in each respective portion of the beam, each having its selected effective center wavelength.

It will also be understood by those skilled in the art that according to aspects of an embodiment of the present invention the variably refractive optical elements 100, 100' may be inserted in any part of the optical path, e.g., in a line narrowing module 26 which may incorporate a dispersive center wavelength selecting element, e.g., an eschelle grating in a Littrow arrangement (not shown) or other center wavelength selective elements, which may, e.g., select the center wavelength of the beam 140 or portion 102, 102' of the beam 140 in accordance with, at least in part, the angle of incidence of the beam 140 on the wavelength selective element (not shown). Also according to aspects of an embodiment of the present invention, the system may incorporate an additional angle of incidence selective element, e.g., a fast tuning mirror intermediate the variably refractive optical element(s) 100 or 100' and the dispersive center wavelength selection element, which in some cases may be dithered pulse-to-pulse or essentially pulse-to-pulse and in other cases fixed, e.g., over a burst. In this manner, in one aspect of the invention, the variably refractive optical element(s) may select the separation between the center wavelengths of the respective spectral peaks in the respective plurality of portions of the beam 140, e.g., portions 102, 102' and the additional angle of incidence selection element, e.g., fast tuning mirror (not shown) may select the wavelength of the center of gravity of the spectrum defined by the plurality of peaks, i.e., in the case of two spectral peaks, the wavelength of the mid-point between the center wavelengths of each respective spectral peak, or in the case of three peaks, the center wavelength of the center peak of the three peaks.

As is known in the art, the fast tuning mechanism may comprise a tuning mirror defining an angle of incidence between the laser light pulse beam and the dispersive wavelength selective element, which is positioned to define the angle of incidence of the beam 140 on the dispersive optical element (not shown) by a combination of an electromechanical course positioning mechanism and a fine positioning mechanism comprising a material whose properties are altered by the application of an electrical field to the material, with the material comprising, e.g., a piezoelectric material.

It will further be understood by those skilled in the art that a single insertable wedge, e.g., a variably refractive optical element wedge 100 (multiple wedges) or 100' (continuouly curved concave cylindrical lens surface) has many positive attributes including simplicity, compactness, fill extraction of the optic, and low loss. However, the choice of wedge angle (or position on the continuously curved surface) sets the dual spectral peak separation with very little adjustment as the wedge is rotated. Therefore, different center wavelengths may thus be produced, and then a central wavelength between them may be selected, e.g., as discussed above with an additional angle of incidence selecting mechanism, e.g., a fast tuning mirror, but the center wavelength in the portion of the beam passing through the refractive optical element, i.e., wedge and the portion not passing through a wedge, will be a fixed distance apart, peak to peak.

Instead of a single refractive optical element 100, 100', e.g., a wedge, inserted into one half of the beam 140, the use of two wedges into the top 102' and bottom 102 of the beam 140, which can be rotated with respect to each other, which can be utilized to vary a peak separation between the peaks of the selected two center wavelengths $\lambda_1$ and $\lambda_2$. The difference between this concept and the single wedge concept is that the two wedges can have a much larger wedge angle, allowing for stronger tuning of peak position with wedge rotation. For example, a single wedge design would have a wedge angle that creates a nominal 2 pm peak separation and very little adjustment with rotation. The dual wedge design can employ wedges that otherwise would create a 20 pm separation and thus a much greater adjustment with rotation. This effect can also be achieved by the use of two variably refractive optical elements, e.g., 100 or 100', each intersecting part of the beam 140, as noted above. Other similar arrangements are discussed in co-pending application Ser. No. 10/847,799 referenced above.

The choice of insertion location is a matter of practicality. If the wedges are inserted in the high magnification region, they must be larger and have very good wavefront quality. If they are inserted in the low magnification region, they can be smaller and the effect from the wavefront error, e.g., associated with the edge of the optics across the middle of the beam can be minimized. If the wedges are inserted before the first prism, e.g., in a multi-prism beam expander (not shown) as part of a line narrowing package 26, the insertion distance need be less than 5 mm and thus the actuator can be simplified.

Adjustment for balance of energy between each peak can be accomplished by translating the two wedges or other optical elements vertically, e.g., placing the split line either higher or lower in the beam.

The creation of a desired RELAX spectrum, e.g., a dual peaked spectrum, e.g., with the dual wedge concept leads to a spatial distribution, e.g., top vs. bottom of the spectral content in the output beam but not a temporal distribution, e.g., changing from one pulse to another pulse. Such a condition can lead to problems in certain applications of the laser output light pulses, e.g., in semiconductor optical lithography due, e.g., to the details of operation of certain stepper/scanner illumination designs. To correct for the top vs. bottom spectral content, the above noted homogenizer 200 may be utilized to homogenize the beam, e.g., by flipping and overlapping in the vertical direction. For certain laser systems that employ what applicants' assignee refers to as an OPuS pulse stretcher, e.g., a 4×OPuS, as discussed in above referenced patent applications assigned to the applicants' common assignee, e.g., the 6 mirror OPuS design that produces −1×imagining may be utilized for beam homogenization. While this may satisfy the end user's needs for a RELAX multiple peal spectrum to be distributed throughout the spatial distribution of the beam, or nearly so, there still may be a need for homogenization as part of an effective metrology arrangement.

One possible method for producing an homogenized output laser light pulse beam that is also useful for homogenizing the input to the metrology package 50 is to insert a beam flipper 200 as discussed above prior to the beam splitter 30 that directs a portion of the output beam 40 into the metrology package 50. This optical design can flip the beam end-over-end. Such a configuration may also be employed in several locations within a MOPA laser configuration, e.g., between the output of the MO stage and the input of the PA stage, e.g., as part of what applicants' assignee refers to as a Wave Engineering Box ("WEB") on, e.g., an XLA-100 MOPA laser system, e.g., as a replacement for the upper WEB ("MO WEB") turning mirror. Applicants have also investigated this as a possible means for producing better profile control and improved energy stability even in non-RELAX applications since it would homogenize the beam prior to amplification by the PA.

For use in non MOPA configured laser systems, e.g., those sold by applicants' assignee under the designations of the NL-7XXX and/or ELS-7XXX, this optical function can likely be the homogenizer 200 discussed above, which may be fit between the OC 24 and the wavemeter 50, as discussed above, and illustrated schematically in FIG. 9. The reflectivity of the beam splitter 202 can be chosen so that the summation of energy for all the flipped sub-pulses is generally equal to that of all the non-flipped pulses.

Figure 6:
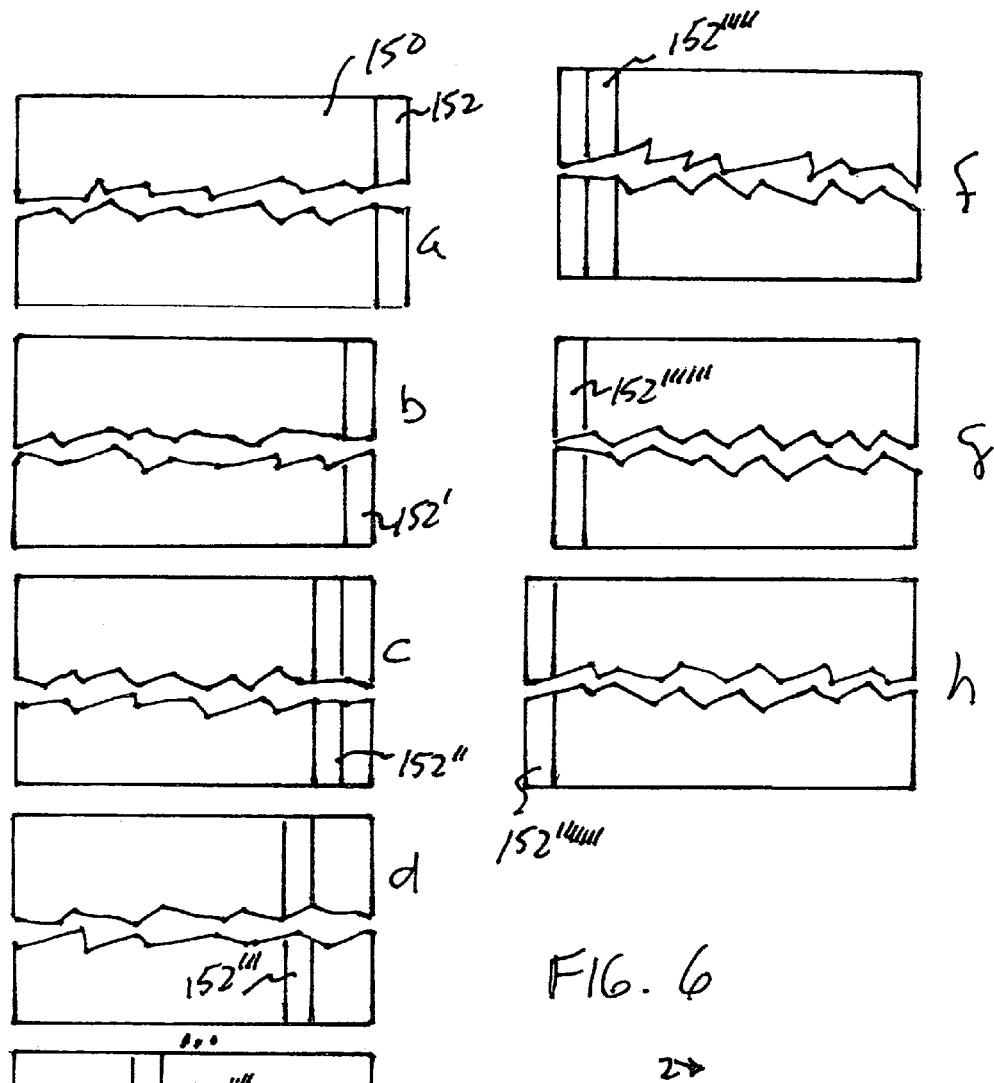
FIG. 6 shows schematically an exposure period according to aspects of an embodiment of the present invention.
Figure 18:
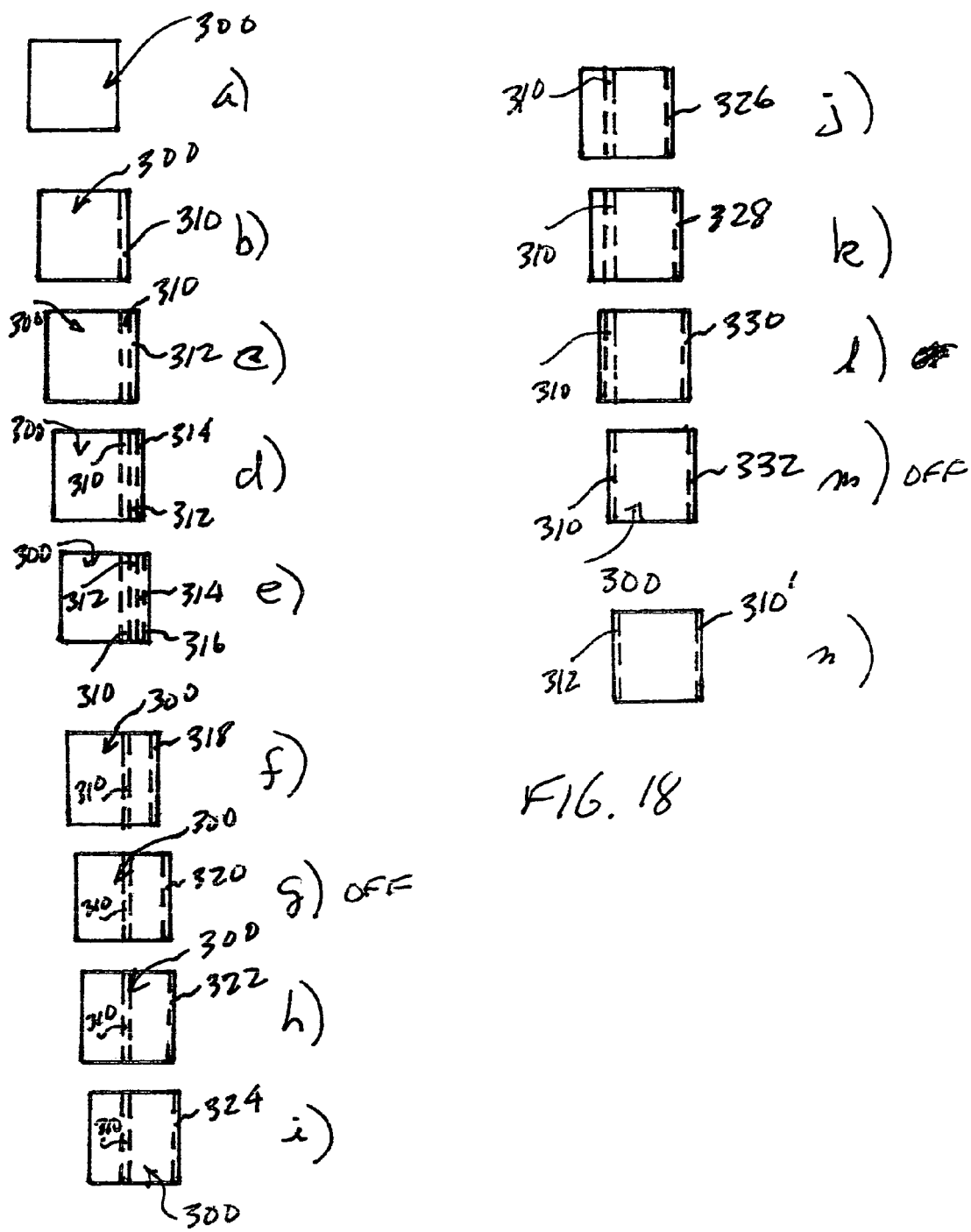
FIG. 18 shows schematically a scan window delivering pulses to a workpiece according to aspects of an embodiment of the present invention.

Turning now to FIG. 6 there is shown schematically an illustration of aspects of an embodiment of the present invention adapted to deliver a laser output light pulse comprising a plurality of laser output light pulses of varying center wavelengths, e.g., two different center wavelengths, $\lambda_1$ and $\lambda_2$ to a workpiece, e.g., an integrated circuit wafer (not shown) to, e.g., expose photo-resist on the wafer according to, e.g., a pattern on a reticle (not shown), e.g., within a temporal scan window 150. The temporal scan period 150 is illustrative of irradiation of a portion of the wafer by a certain number of pulses within, e.g., a burst of pulses, whereby the relative motion of a scan window 300 (shown in FIG. 18) and the wafer (not shown) during the temporal scan period is such that as the pulses within the portion of the burst, e.g., pulses 152'–152'''''' move through the temporal scan period 150 irradiating a portion of the wafer containing the photo-resist to be exposed is irradiated by each successive pulse, e.g., pulses 152'–152'''''', as illustrated in FIG. 18. It will be understood by those skilled in the art that the relative movement between the reticle (not shown) and the wafer (not shown) is such that every slice of wafer being irradiated by the laser light pulses in a burst of pulses may see many more than, e.g., the twelve illustrative pulses shown in FIG. 6 to be passing through an imaginary temporal scan window, such that, the effect of, as explained below, turning off the laser periodically, as explained below, does not significantly negatively effect the exposure of the photo-resist on the wafer.

Figure 7:
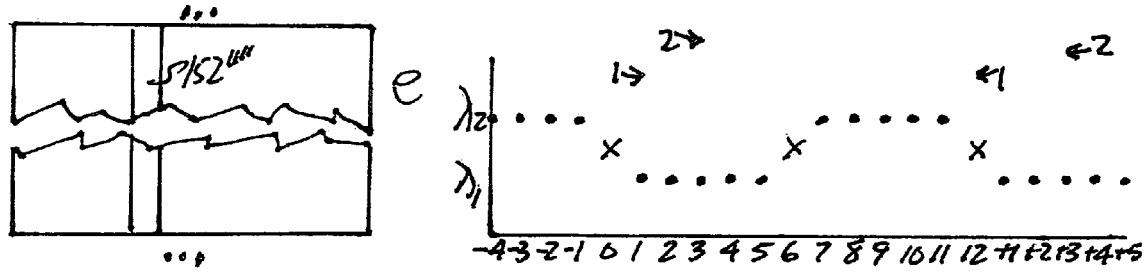
FIG. 7 shows a chart of laser output light pulses delivered to a workpiece during the exposure period illustrated in FIG. 6 according to aspects of an embodiment of the present invention.

As illustrated in FIG. 6a a pulse 152, just prior to the beginning of the temporal scan period 150 is shown (pulse 0 as illustrated in FIG. 7), which is followed as illustrated in FIG. 6b by a first pulse 152' within the temporal scan period 150 (pulse 1 in FIG. 7) that may be, e.g., at a first center wavelength $\lambda_1$, and be followed, e.g., successively by pulses 152'', 152''' etc. (pulses 2–5 in FIG. 7) all, e.g., at the same center wavelength $\lambda_1$, followed by a pulse (6 in FIG. 7) for which pulse the laser controller is programmed to not fire the laser, while, e.g., the center wavelength selecting mechanism, e.g., a fast tuning mirror (not shown) is moved to select for the next successive pulse (pulse 7 in FIG. 7) a second center wavelength $\lambda_2$, followed successively by pulse 152'''' (pulse 8 in FIG. 7) through pulses, 152''''', 152'''''' (pulses 11 and 12 in FIG. 7) at the second center wavelength $\lambda_2$ except for pulse 152'''''' shown in FIG. 6 (pulse 12 in FIG. 7, which is a pulse where again the laser controller causes the laser not to fire. Pulse 152'''''' (pulse 12 in FIG. 7) then becomes the pulse 152 just before a successive temporal scan period and pulse 152'''''' becomes the first pulse 152' in a next temporal scan period (pulse +1 in FIG. 7).

It will be understood by those skilled in the art that according to aspects of an embodiment of the present invention illustrated schematically in FIGS. 6 and 7 irradiation of the wafer may be accomplished using, e.g., a fast tuning mirror without dithering the position of the mirror to deliver a different center wavelength on each pulse, and without the detrimental effects on the overall spectrum of irradiating the wafer with a pulse where the fast tuning mirror may be in transition from establishing the first center wavelength $\lambda_1$ to $\lambda_2$ and/or from a $\lambda_1$ to a $\lambda_2$ in the case of a plurality of possible $\lambda$'s, $\lambda_1-\lambda_n$. In addition, at higher pulse repetition rates, dithering, e.g., the fast tuning mirror on every pulse may be difficult, e.g., due to mechanical resonance and the like at certain frequencies or above a certain frequency of dithering, and according to aspects of an embodiment of the present invention just discussed, these detrimental effects may be avoided or at least effectively reduced in magnitude.

Figure 8:
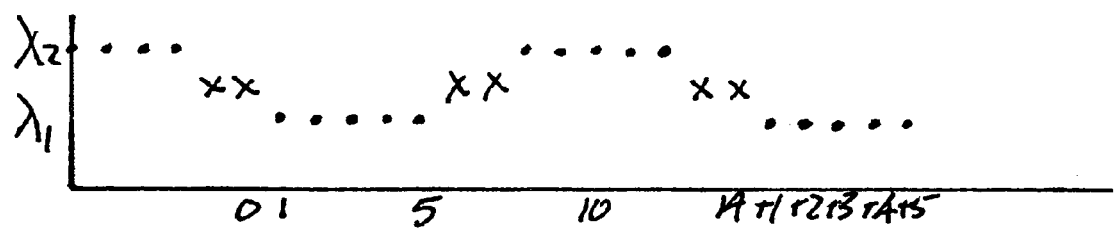
FIG. 8 shows a chart of another possible pattern of pulses of different wavelengths that can be delivered to a workpiece during an exposure period similar to that illustrated in FIG. 6 according to aspects of an embodiment of the present invention.

FIG. 8 illustrates a dithering scheme schematically in which a temporal scan period of fourteen pulses may be utilized, with the laser controller programmed to skip firing of more than one successive laser pulses, e.g., two successive laser pulses during the change in position of, e.g., the tuning mirror between center wavelength $\lambda_1$ and $\lambda_2$. This may be necessary, e.g., at higher pulse repetition rates of, e.g., around 6 kHz and above.

It will also be understood by those skilled in the art that the temporal scan periods as illustrated may extend for any number of pulses N, with e.g., (N–2)/2 pulses at a first wavelength $\lambda_1$ and (N–2)/2 pulses at a second center wavelength $\lambda_2$ with two transitions, one to the first (N–2)/2 pulses, and one from the first (N–2)/2 pulses to the second (N–2)/2 pulses, where the laser is not fired, provided (N–2)/2 is an integer number. Similarly, for any given scan period of N pulses there may be more than two center wavelengths, e.g., three center wavelengths, e.g., $\lambda_1$, $\lambda_2$ and $\lambda_3$, e.g., with each occupying (N–3)/3 successive pulses (where (N–3)/3 is an integer number) and with, e.g., three transition pulses at each of which the laser is not fired. Similarly variations on the above illustrated multiple center wavelength schemes may be utilized, e.g., with, as noted above, more than one transition pulse between, e.g., each of the (N–3)/3 groups of respective separate center wavelength pulses, i.e., two such transition pulses between groups, for each of which the laser is not fired.

Those skilled in the art will also appreciate that the respective arbitrary temporal scan period 2 may, e.g., as illustrated in FIG. 7 run from pulse 3 through pulse +3 as shown in FIG. 7 with the same effect as the arbitrary temporal pulse scan period 1 shown in FIG. 7 and discussed above.

Turning now to FIG. 18 there is illustrated schematically and by way of example only the spatial equivalent of what is shown in FIGS. 6–8. In FIG. 18 there is illustrated schematically a physical scan window 300, which in operation scans across a spot on an integrated circuit wafer to be exposed, e.g., the photoresist over a portion of an integrated circuit die. At time 1 in FIG. 18a, the exposure scan window has not yet progressed to overlie the portion of the die to be exposed. In FIG. 18b, a narrow strip within the scan window over lies a narrow strip 310 on the die and, e.g., as illustrated in FIG. 7, the whole scan window 300 is illuminated with a first wavelength, e.g., $\lambda_1$ (pulse 1 in FIG. 7). In FIG. 18c, the pulse window 300 overlies another narrow strip 312 of the die and both strips 310 and 312 are illuminated with pulse 2 in FIG. 7 at $\lambda_1$. Similarly in FIGS. 18d–f, narrow strips 314, 316 and 318 come within the scan window and are successively illuminated with, respectively pulses 3–5, 4–5 and 5 of FIG. 7. In FIG. 18g, corresponding to pulse 6 in FIG. 7, the laser is not fired, and none of the narrow strips within the scan window 300 are illuminated on that pulse, including the newly entering narrow strip 320. Once again the laser is fired in FIG. 18h, with a new center wavelength of $\lambda_2$ and newly entering narrow strip 322 along with strips 310–320 are illuminated for the first time with $\lambda_2$. This then continues through FIG. 18m where newly entering pulse 332 enters the scan window, first narrow strip 310 is about to leave the scan window and the laser is again not fired, i.e., corresponding to pulse 12 in FIG. 7. In FIG. 18n the entire process begins again for a new first narrow strip 310' which enters the scan window for the first time.

It will be understood by those skilled in the art that for each of the narrow strips, 310–332 the exposure will be to five pulses of $\lambda_1$ and five pulses of $\lambda_2$ and two off pulses, except that the exposure will be in a different order. For example, narrow strip 312 will see four pulses of $\lambda_1$ and a off pulse, followed by five pulses of $\lambda_2$ followed by an off pulse, and then a final pulse of $\lambda_1$ as illustrated in FIG. 18n, when the new first narrow strip 310' is entering the scan window 300 and the narrow strip 312 is about to leave the scan window 300.

In this manner, as will be understood by those skilled in the art, according to aspects of the present invention, a narrow band short pulse duration gas discharge laser output light pulse beam producing system is provided for producing a beam comprising bursts of a selected number of laser output light pulses at a selected pulse repetition rate, for utilization in a light utilizing tool having a scan period lasting for a selected number of pulses, N, in the burst of pulses, where N is an even integer, which may comprise a dispersive wavelength selection optic within the line narrowing package 26, selecting a center wavelength for each pulse, determined at least in part by the angle of incidence of the laser light pulse beam containing the respective pulse on the dispersive wavelength selection optic; a tuning mechanism, e.g., a fast tuning mirror within the line narrowing package 26, operative to select a first angle of incidence for a plurality of adjacent pulses within the scan period, e.g., pulses 1–5, or alternatively, e.g., pulses 3–5, as illustrated in FIG. 7, followed by at least one first transition pulse, e.g., pulse 6 as illustrated in FIG. 7, where the laser is not fired, and a second angle of incidence for a second plurality of adjacent pulses within the scan period, e.g., pulses 7–11 as illustrated in FIG. 7, followed by at least one second transition pulse, e.g., pulse 12 as illustrated in FIG. 7, where the laser is not fired, with the total number of pulses at the first angle of incidence and at the second angle of incidence and transition pulses equaling N pulses, e.g., pulses 1–12 of FIG. 7 or, alternatively, pulses 3–+3 of FIG. 7; a laser controller controlling the laser output light pulse beam producing system to not produce a laser output light pulse during each transition pulse; and; a system controller adapted to control the laser system to repeat the above steps a plurality of times within the burst, the number of times equaling the number of scan periods occurring during the burst. This is also illustrated in FIG. 8, where, e.g., the scan period could start at pulse 1 and end at pulse 14, with transition pulses at pulses 6 and 7 and a pulses 13 and 14, or start at pulse 3 and end at pulse +3, still totaling 14 pulses with the same transition pulses. The schemes where the adjacent pulses of one center wavelength are separated into two groups, deliver the same number of pulses at each center wavelength, as if both groups remained fully adjacent, i.e., in the example where the scan period starts on pulse 1. Also, of course, the number of "adjacent" pulses, whether fully adjacent or partly adjacent, of the same center wavelength, could be more or less than 5 as shown in the illustrative example.

It will further be understood by those skilled in the art that the scan window illustrated in FIG. 18 is only an example of aspects of an embodiment of the present invention. The scan window may include any number of pulses within the limits of beam width, pulse repetition rate, throughput desired and like parameters, with the RELAX requirements being met, e.g., if the total number of pulses N includes an equal number of pulses at each wavelength, to balance the dose at each wavelength and, therefore also the integrated spectrum between the multiple peaks, and an equal number of transition pulses. Thus, e.g., two groups of pulses 1–12 as illustrated in FIG. 7 or two groups of pulses 1–14 as illustrated in FIG. 8 could be grouped together to form, respectively, scan windows of 24 or 28 pulses, including in the first instance 10 pulses each of $\lambda_1$ and $\lambda_2$ and 4 transition pulses or 8 transition pulses, respectively.

It is believed by applicants that the separation between peaks of a selected plurality of center wavelengths, e.g., a two peak separation will need to be more or less continuously variable. This is because, e.g., in some applications lateral chromatic aberrations can be a concern, e.g., for semiconductor optical lithography. Lateral chromatic aberration acts like chromatic telecentricity, producing two images shifted left and right as one moves through focus. The result is a reduction in contrast. To compensate for this effect an element in the illuminator can be shifted, but many illuminators are not capable of this, and for succeeding generations, e.g., immersion DUV tools, this capability may also not be present. Therefore, users of laser output light pulse beams may not find acceptable a RELAX implementation in which a multiple peak spectrum, e.g., a twin peak spectrum is produced, e.g., with the top of the beam at one wavelength and the bottom at the other, which can, e.g., make the telecentricity worse and make test and setup more difficult and complicated. For example, for certain DUV photolithographic lenses, the relative lateral shift vs. focus shift for several lenses is listed below.

|  | Focus Shift | Lateral Shift |
|---|---|---|
| S308G-im | 2.7 | 4.8 |
| S306C | 1.9 | 2.6 |
| S205C | 1.0 | 1.0 |

From this data one can see that significant impact on focus shift results from lateral shift increases.

In certain applications however, both the reticle plane and the pupil plane can be scrambled from the laser beam input and a top/bottom split for a twin peak spectrum may not cause any adverse effects.

For stepper/scanner that use, e.g., "nibblers" to adjust the integrated dose uniformity, a line-center dithering method for producing a RELAX spectrum may lead to an imbalance between the two peaks in various regions of the exposure slit, e.g., due to slit height variation which may be on the order of, e.g., 10%.

In some cases, lateral chromatic aberrations in the stepper/scanner lenses may have an acceptably small effect on performance with multi-peaked RELAX spectrum, e.g., a two peak spectrum.

Figure 10:
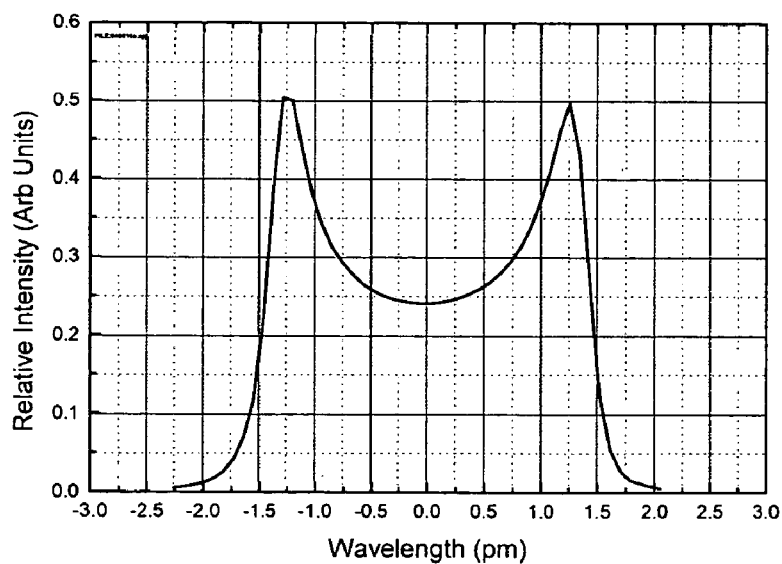
FIG. 10 shows a spectrum delivered according to aspects of an embodiment of the present invention.

Applicants have also examined producing a RELAX spectrum via rapid variation in the line-center rather than producing the twin peaks via an optical method. By way of illustration three waveshapes of line-center dither have been explored with simulations, with the resulting integrated spectra. The first and simplest waveshape is a low frequency sine-wave with a period chosen to match the nominal sliding exposure window of the scanner or multiple of the period. The resulting integrated spectrum is shown in FIG. 10. This "Bat Man" shape appears to be beneficial from the standpoint of having peaks at a desired selected wavelength separation, but also has a significant amount of energy between the two peaks. The peaks can be selected by selecting between a first angle of incidence for a first center wavelength, $\lambda_1$, and a second angle of incidence for a second center wavelength, $\lambda_2$, or by an integrated effective first angle of incidence and an integrated effective second angle of incidence, and the energy distribution between the peaks may be determined by the effectiveness of slewing from one angle of incidence to the other, or along a trajectory of angles, pulse to pulse or group to group, resonance effects and other effects.

A second waveshape examined may be generated by driving the tuning mirror with a rounded square wave in that the transition from one extreme line-center value to the other is not instantaneous, but instead follows a sine-wave trajectory with the highest practical frequency. For the resulting integrated spectrum shown in FIG. 11, the sine wave transition between the two extremes was equivalent to 200 Hz. The spectrum shown in FIG. 11 seems even more promising than that from the simple sine-wave as shown in FIG. 10 because it has very little energy in between the peaks.

Figure 12:
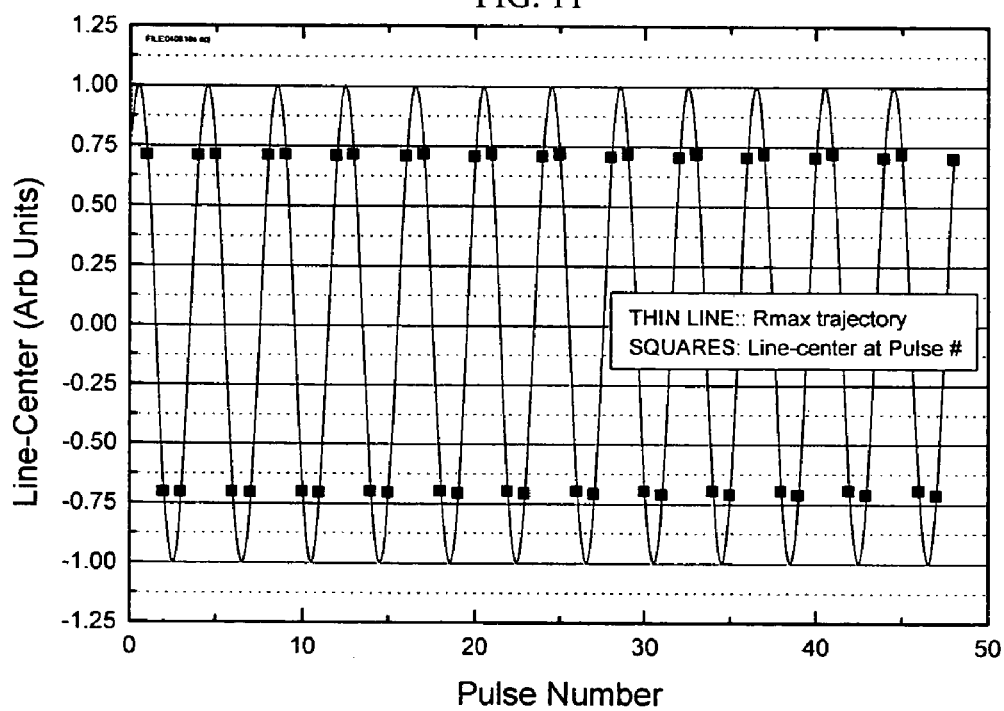
FIG. 12 shows the positioning of a fast tuning mirror according to aspects of an embodiment of the present invention.
Figure 13:
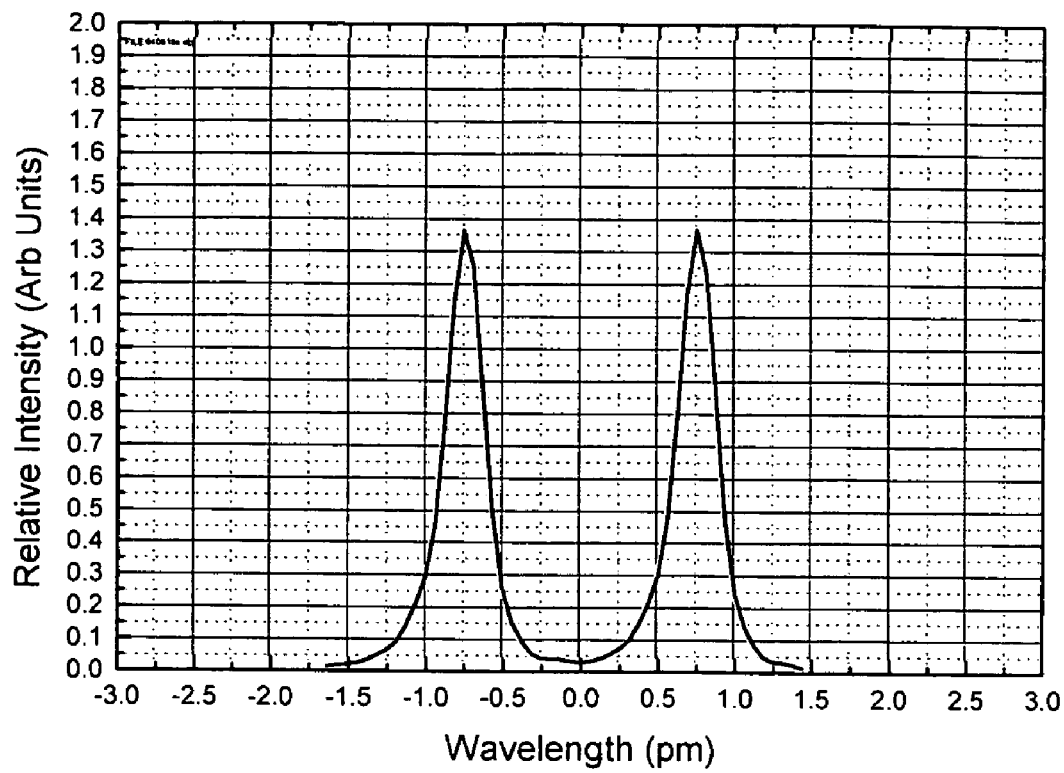
FIG. 13 shows a spectrum delivered according to aspects of an embodiment of the present invention.

The third and nearly ideal waveshape examined was produced using a sinusoidal Rmax motion with a frequency exactly ¼ that of the laser repetition rate and with a phase relative to the laser firing such that the sinusoid is "sampled" by the laser pulse at only two line-center values, as illustrated in FIG. 12. A plot of this spectral shape is shown in FIG. 13. As can be seen from the plot of FIG. 13, there are only two line-center values produced when the sinusoid is selected to have the right frequency and also the right phase. The spectrum produced by this waveshape for the tuning mirror drive signal is the ideal twin peak spectrum.

As can be seen from the above, the RELAX split spectrum techniques depending upon the chosen implementation can have a significant amount of spectral energy contained between the two peaks. While it may be an ideal to have little or no energy at the mid-point between the spectral peaks, taking two realistic spectra, shifting and overlapping them, there is a noticeable amount of energy contained between the two peaks.

As noted in above referenced copending patent applications, a RELAX spectrum may be generated using, e.g., an acousto-optic element for producing the ability to shift line-center on a shot-by-shot basis, which also would allow for a RELAX spectrum to be formed by dithering the line-center on an every-other shot basis or every several shots basis. Such dithering should be compatible with even the shortest exposure window used by stepper/scanners. An added advantage is the facilitation of nimble line-center control, providing, e.g., dramatically improved wavelength sigma performance and near elimination of line-center chirp and vibration induced line-center variation by, e.g., the provision of a feed-back loop that is, e.g., not slowed to the sub-kilohertz level, as it is today, e.g., due to resonance issues, e.g., with the mechanical fast tuning mirror ("Rmax") assembly (mounting and mechanical and electromechanical actuators).

Figure 14:
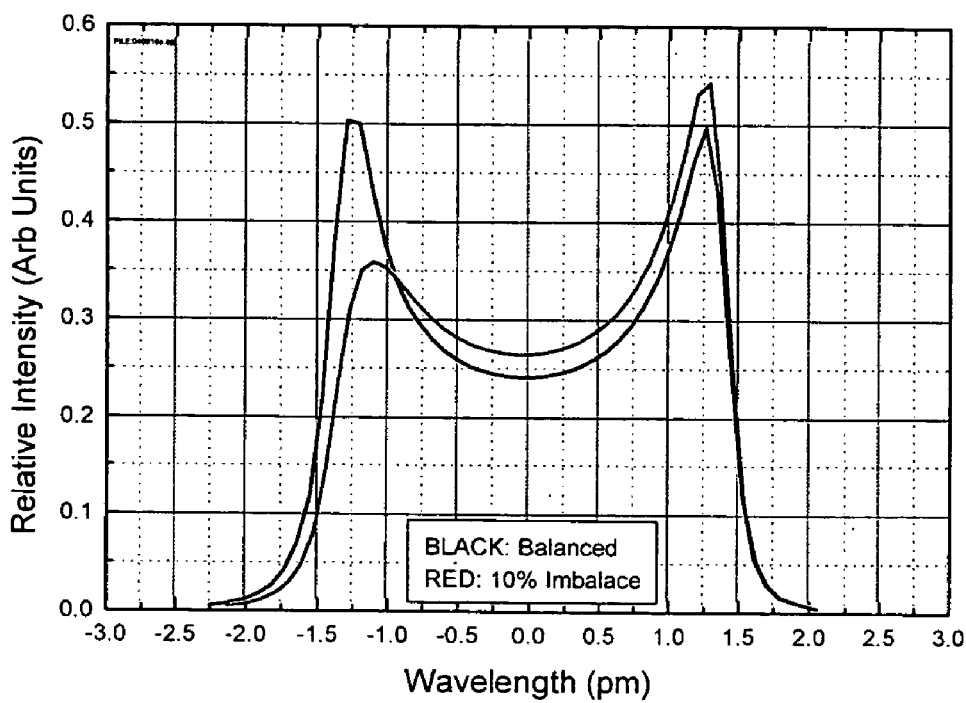
FIG. 14 shows the results of an imbalance of energy in delivered pulses of different center wavelengths according to aspects of an embodiment of the present invention.

The first two waveshapes discussed above, the simple sine wave and the rounded square wave, may need to be used only where the period of the scanning window is equal to the line-center dither period, as discussed above. In certain applications the width of the exposure slit utilized in a stepper/scanner process may be trimmed for certain performance reasons. This can modify the size of the slit resulting in a modification of the temporal and/or spatial size of the exposure window, which if not corrected for will result in the window not corresponding to the line center dither period. Such a mismatch can, e.g., lead to an imbalance in the integrated spectrum as shown for example in FIG. 14 illustrating a simple sine wave dither with a slit width change of 10% from the center wavelength control dither. A rounded square wave waveshape suffers from a similar spectral imbalance when the slit width is changed by 10%.

A high frequency sine wave, e.g., at some fraction of the laser pulse repition rate, e.g., 500 Hz for a 4 kHz laser, does not suffer any significant spectral change upon a variation in the slit width, but must, e.g., be in phase with the laser firing. The worst case phase error leads to fully half of the energy moved from the peaks and relocated around the central wavelength point.

Turning now to FIGS. 16 and 17 there is shown is schematic block diagram form some basic components of systems for dithering the center wavelength, e.g., on a pulse to pulse or series of pulses basis as discussed above. A simple sine wave and the rounded square wave dithering signal can be implemented as shown in FIG. 16, which illustrates a line narrowing module 26, with a PZT element 222 and a stepper motor 224, each of which, as is well known in the art, serving to position a fast tuning center wavelength selecting tuning mirror (not shown) based upon a PZT drive signal 230, e.g, of ±50 volts, and a stepper motor phase signal 232 which are generated by a wavelength control module ("WCM") in response to metrology measurements made on received laser output light pulse beam diagnostic portion 44. The PZT signal 230 may be modulated, e.g., with a signal generator 240 that implements, e.g., a sine wave signal or a rounded square wave (pictured in FIG. 16), which may be implemented, e.g., as an integrated circuit analog signal generator. The form and period of the generated waveform may be selected in response to feedback input from a scanner 280, regarding, e.g., the scan window size, desired center wavelengths and thus center wavelength separation and central wavelength. The scanner 280 or the wavelength control module 220 may, as appropriate or as desired, select the modulation scheme. The laser controller 290 may also provide, signals, e.g., representative of laser repetition rate, pulse timing, etc. as appropriate.

Figure 15:
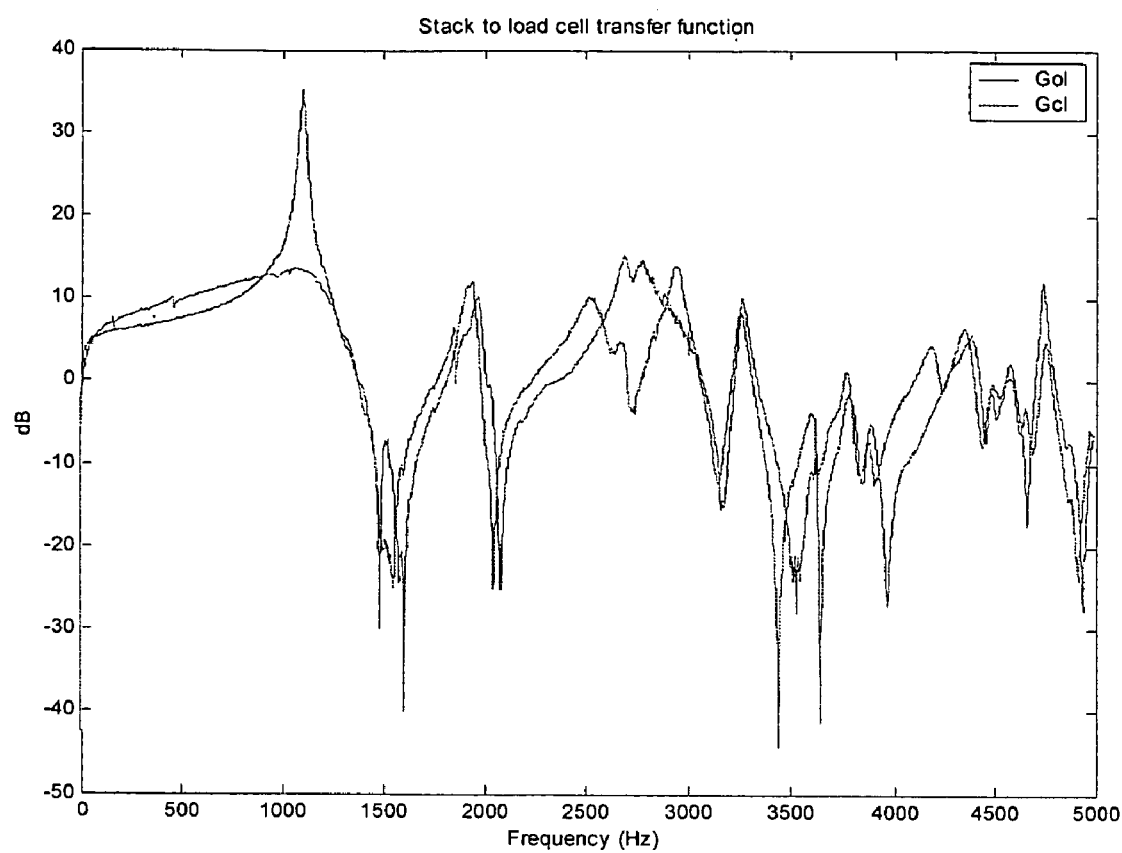
FIG. 15 shows the results of utilizing a PZT element load cell feedback for resonance control according to aspects of an embodiment of the present invention.

A higher frequency signal generator may also be so implemented with a signal generator, e.g., generating high frequency sign waves or rounded square waves with the addition of a load cell 250 at the PZT stack 222 and a controller 260 to condition the PZT control signal 230 in order to, e.g., suppress energy at and near any resonance frequencies of the fast tuning mirror ("Rmax") assembly, e.g., as illustrated in FIG. 15, wherein the blue line shows the response without suppression and the red line shows the response with active suppression turned on. The result is a much flatter frequency response, e.g., in the region(s) leading up to the resonance(s) of the Rmax mechanics, e.g., at around 1000 Hz. With such suppression in place, the wavemeter could then supply the high frequency sine wave, e.g., at about one fourth the laser firing rate (with the appropriate phase) and expect that the Rmax mechanics will respond more uniformly for any frequency chosen. An alternative could be to place the sine wave generation capability inside the controller box 260, responsive to the signal 230 from the wavelength control module 220, and/or signals from the scanner 280, and/or laser controller, 290, as noted above, e.g., indicative of the laser frequency, the desired peak separation, the desired central wavelength, and the laser pulse timing.

Those skilled in the art will understand from the above, the various advantages of the RELAX implementations discussed above. For example, for optical generation, e.g., with the variably refractive optical elements as discussed above, the quality of the spectrum obtainable is very nearly ideal, with multiple peaks in spatially separate parts of the beam, or homogenized as necessary, and produceable in response to signals from, e.g., a scanner, indicative or, e.g., the need for a RELAX spectrum and the desired peak separation, with the ability to toggle RELAX on an off, e.g., by the use of insertable and articulated optical elements, e.g., the variably refractive optical elements, e.g., inserted in the optical path between the laser and the grating in existing line narrowing modules.

For a simple sine wave dithering of the fast tuning mirror, the quality of the spectrum is as shown in FIG. 10. Implementation of RELAX can be in response to signals from the scanner 280, and/or the laser controller 290, indicating the desire for a RELAX spectrum, the desired number of peaks, the desired peak separation, the pulse repetition rate and scan window size. The laser system controller can then balance the periodicity of the sine wave to the scan window size. Except for the addition of a waveform generator to produce the simple sine wave modulation of the fast tuning mirror, no significant changes need to be made to the existing line narrowing and wavelength control hardware and software.

Figure 11:
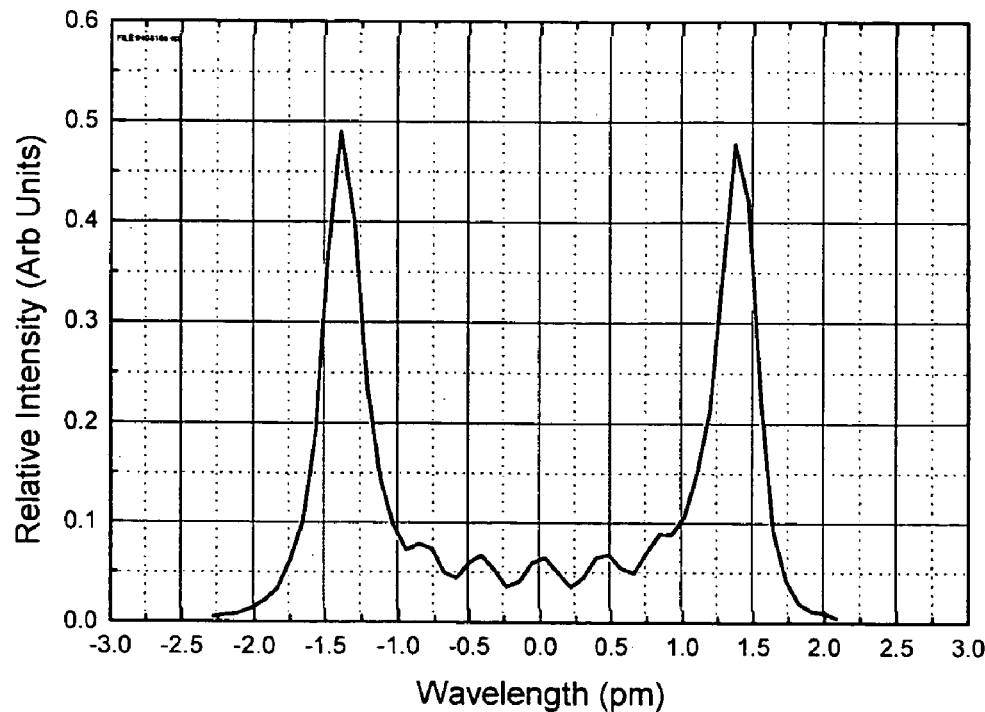
FIG. 11 shows a spectrum delivered according to aspects of an embodiment of the present invention.

For a rounded square wave implementation the spectrum would be close to an ideal RELAX spectrum, with some energy in center wavelength positions, as shown in FIG. 11. The same interface information with the scanner would be utilized here as for the simple sine wave modulation and the same modifications or lack thereof to existing hardware and software. Since the spectrum is sensitive to phase between fast tuning mirror ("Rmax") and laser firing, the system may require a phase lock loop and a certain number of pulses in each burst to establish the phase lock.

For the square wave with transition (off) pulses, the laser controller can respond to signals from the scanner indicating the need for a RELAX spectrum, the desired peak separation and the scan window size and select the number of pulses N, the number of transition pulses, the groupings of the pulses and transitions, as discussed above to properly adjust the RELAX multiple peaked spectrum to the scan window as noted above, e.g., to balance the dose between the selected spectral peaks.

For a high frequency sine wave modulation, the spectrum will also be nearly ideal, with the use of the same interface information as for the simple sine wave and rounded square wave modulation. The system may require the addition of a load cell at the PZT driver, e.g., for resonance feedback, and the analog waveform generator. Simulations have indicated to applicants that this spectrum is very nearly an ideal RELAX multi-peak spectrum, with very little reduction in DOF effects from ideal RELAX spectrum.

Applicants have tested a prototype of a RELAX system using the fast tuning mirror, which was made deformable by cutting a groove in the back (non-reflecting) side of the mirror and using a magnetic field to alter the angle between the two portions and thus the angle of incidence of the portions of the beam reflecting from the tuning mirror onto the grating to produce twin spectra of a selected separation peak to peak and the angle of the entire assembly defining the central wavelength. Applicants have found that for this version according to aspects of an embodiment of the present invention, current metrology designed for single peak spectrometry can have difficulty in resolving twin peaks, particularly spaced closely together, e.g., within several pm peak to peak. Applicants have used have found that existing fiber optic interfaces in existing metrology units, e.g., wavemeters, may be used to provide suitable multiple peak spectrometry with other than the existing wavemeter systems. Applicants have also noted the need for the prevention of any variation in pulse repetition rate, which may affect the stability of, e.g., the spectral peaks amplitude ratio.

We claim:

1. A narrow band short pulse duration gas discharge laser output light pulse beam producing system, producing a beam comprising laser output light pulses at a selected pulse repetition rate, comprising:
   a dispersive center wavelength selection optic selecting at least one center wavelength for each pulse determined at least in part by the angle of incidence of the laser light pulse beam containing the respective pulse on the dispersive wavelength selection optic:
   a tuning mechanism operative to select at least one angle of incidence of a first spatially defined portion of the laser light pulse beam containing the respective pulse upon the dispersive center wavelength selection optic: and,
   the tuning mechanism comprising a variably refractive optical element defining a plurality of refractive angular displacements of the first spatially defined portion of the laser light pulse beam passing through the variably refractive optical element at one of a plurality of positions of incidence of the laser light pulse beam on the variably refractive optical element;
   the laser output light pulse beam comprising a plurality pulses having a first center wavelength and a plurality of pulses having a second center wavelength separated by a selected difference in the respective center wavelengths;
   a laser output light pulse beam parameter metrology nodule;
   a laser controller;
   a wavelength controller controlling the respective center wavelengths and the difference in center wavelengths in response to at least one signal from the beam parameter metrology module and at least one signal from the laser controller.

2. The system of claim 1 further comprising:
   the variably refractive optical element comprising:
   a first generally flat face defining a surface of incidence for the laser light pulse beam; and,
   a second multifaceted face defining a plurality of generally flat surfaces of exit for the laser light beam, each surface of exit defining a unique and discrete angle of exit from the variably refractive optical element.

3. The system of claim 1 further comprising:
   the variably refractive optical element comprising: a first generally flat face defining a surface of incidence for the laser light pulse beam; and,
   a second generally cylindrical face defining a plurality of curved exit surfaces for the laser light beam, each exit surface approximating a unique and discrete flat surface of exit for the laser light pulse beam each such curved surface of exit approximating a unique and discrete angle of exist continuously increasing or decreasing along a longitudinal extent of the variably refractive optical element.

4. The system of claim 1 further comprising:
   a translating mechanism translating the variably refractive optical element in relation to the laser light pulse beam generally parallel to a first axis of the beam profile and in a direction generally aligned with the longitudinal extent of the variably refractive optical element.

5. The system of claim 2 further comprising:
   a translating mechanism translating the variably refractive optical element in relation to the laser light pulse beam generally parallel to a first axis of the beam profile and in a direction generally aligned with the longitudinal extent of the variably refractive optical element.

6. The system of claim 3 further comprising:
a translating mechanism translating the variably refractive optical element in relation to the laser light pulse beam generally parallel to a first axis of the beam profile and in a direction generally aligned with the longitudinal extent of the variably refractive optical element.

7. The system of claim 1 further comprising:
a translating mechanism translating the variably refractive optical element in relation to the laser light pulse beam generally parallel to a second axis of the beam profile and in a direction generally orthogonal to the longitudinal extent of the variably refractive optical element.

8. The system of claim 2 further comprising:
a translating mechanism translating the variably refractive optical element in relation to the laser light pulse beam generally parallel to a second axis of the beam profile and in a direction generally orthogonal to the longitudinal extent of the variably refractive optical element.

9. The system of claim 3 further comprising:
a translating mechanism translating the variably refractive optical element in relation to the laser light pulse beam generally parallel to a second axis of the beam profile and in a direction generally orthogonal to the longitudinal extent of the variably refractive optical element.

10. The system of claim 4 further comprising:
a translating mechanism translating the variably refractive optical element in relation tote laser light pulse beam generally parallel to a second axis of the beam profile and in a direction generally orthogonal to the longitudinal extant of the variably refractive optical element.

11. The system of claim 5 further comprising:
a translating mechanism translating the variably refractive optical element in relation to the laser light pulse beam generally parallel to a second axis of the beam profile and in a direction generally orthogonal to the longitudinal extent of the variably refractive optical element.

12. The system of claim 6 further comprising:
a translating mechanism translating the variably refractive optical element in relation to the laser light pulse beam generally parallel to a second axis of the beam profile and in a direction generally orthogonal to the longitudinal extent of the variably refractive optical element.

13. The system of claim 7 further comprising:
a second tuning mechanism intermediate the dispersive wavelength selection element and the variably refractive optical element.

14. The system of claim 8 further comprising:
a second tuning mechanism intermediate the dispersive wavelength selection element and the variably refractive optical element.

15. The system of claim 9 further comprising:
a second tuning mechanism intermediate the dispersive wavelength selection element and the variably refractive optical element.

16. The system of claim 10 further comprising:
a second tuning mechanism intermediate the dispersive wavelength selection element and the variably refractive optical element.

17. The system of claim 11 further comprising:
a second tuning mechanism intermediate the dispersive wavelength selection element and the variably refractive optical element.

18. The system of claim 12 further comprising:
a second tuning mechanism intermediate the dispersive wavelength selection element and the variably refractive optical element.

19. The system of claim 13 further comprising:
the second tuning mechanism comprising a tuning mirror defining an angle of incidence between the laser light pulse beam and the dispersive wavelength selective element.

20. The system of claim 14 further comprising:
second tuning mechanism comprising a tuning mirror defining an angle of incidence between the laser light pulse beam and the dispersive wavelength selective element.

21. The system of claim 15 further comprising:
the second tuning mechanism comprising a tuning mirror defining an angle of incidence between the laser light pulse beam and the dispersive wavelength selective element.

22. The system of claim 16 further comprising:
the second timing mechanism comprising a tuning mirror defining an angle of incidence between the laser light pulse beam and the dispersive wavelength selective element.

23. The system of claim 17 further comprising:
the second timing mechanism comprising a tuning mirror defining an angle of incidence between the laser light pulse beam and the dispersive wavelength selective element.

24. The system of claim 18 further comprising:
the second tuning mechanism comprising a tuning mirror defining an angle of incidence between the laser light pulse beam and the dispersive wavelength selective element.

25. The system of claim 19 further comprising:
the timing mirror is positioned to define the angle of incidence by a combination of an electromechanical course positioning mechanism and a fine positioning mechanism comprising a material whose properties are altered by the application of an electrical field to the material.

26. The system of claim 20 further comprising:
the timing mirror is positioned to define the angle of incidence by a combination of an electromechanical course positioning mechanism and a fine positioning mechanism comprising a material whose properties are altered by the application of an electrical field to the material.

27. The system of claim 21 further comprising;
the tuning mirror is positioned to define the angle of incidence by a combination of an electromechanical course positioning mechanism and a fine positioning mechanism comprising a material whose properties are altered by the application of an electrical field to the material.

28. The system of claim 22 further comprising:
the tuning mirror is positioned to define the angle of incidence by a combination of an electromechanical course positioning mechanism and a fine positioning mechanism comprising a material whose properties are altered by the application of an electrical field to the material.

29. The system of claim 23 further comprising:
the tuning mirror is positioned to define the angle of incidence by a combination of an electromechanical course positioning mechanism and a fine positioning mechanism comprising a material whose properties are altered by the application of an electrical field to the material.

30. The system of claim 24 further comprising:
the tuning mirror is positioned to define the angle of incidence by a combination of an electromechanical course positioning mechanism and a fine positioning mechanism comprising a material whose properties are altered by the application of an electrical field to the material.

31. The system of claim 25 further comprising:
the material is a piezoelectric material.

32. The system of claim 26 further comprising:
the material is a piezoelectric material.

33. The system of claim 27 further comprising:
the material is a piezoelectric material.

34. The system of claim 28 father comprising:
the material is a piezoelectric material.

35. The system of claim 29 further comprising:
the material is a piezoelectric material.

36. The system of claim 30 further comprising:
the material is a piezoelectric material.

37. A narrow band short pulse duration gas discharge laser output light pulse beam producing system, producing a beam comprising bursts of a selected number of laser output light pulses at a selected pulse repetition rate, for utilization in a light utilizing tool having a temporal scan period lasting for a selected number, N where in N is not equal to 0, of pulses in the burst of pulses, comprising:
a dispersive wavelength selection optic selecting a center wavelength for each pulse determined at least in part by the angle of incidence of the laser light pulse beam containing the respective pulse on the dispersive wavelength selection optic;
a tuning mechanism operative to select a first angle of incidence for at least a first plurality of pulses within the temporal scan period and a second angle of incidence for at least a second plurality of pulses within the temporal scan period, the sum of the at least a first plurality of pulses and the at least a second plurality of pulses equaling N pulses.

38. The apparatus of claim 37 further comprising:
the at least a first plurality of pulses comprises sequential pulses for which the first angle of incidence is selected and the at least a second plurality of pulses comprises sequential pulses for which the second angle of incidence is selected.

39. The apparatus of claim 37 further comprising:
the at least a first plurality of pulses and at least a second plurality of pulses comprises at least a third plurality of pulses within the temporal scan period, for which a third angle of incidence is selected, the sum of the at least a first plurality of pulses; the at least a second plurality of pulses and the at least a third plurality of pulses equaling N pulses.

40. The apparatus of claim 38 further comprising:
the at least a first plurality of pulses and at least a second plurality of pulses comprises at least a third plurality of pulses within the temporal scan period for which a third angle of incidence is selected, the sum of the at least a first plurality of pulses, the at least a second plurality of pulses and the at least a third plurality of pulses equaling N pulses.

41. The apparatus of claim 39 further comprising:
the at least a first plurality of pulses comprises sequential pulses for which a first angle of incidence is selected and the at least a second plurality of pulses comprises sequential pulses for which a second angle of incidence is selected and the at least a third plurality of pulses comprises sequential pulses for which a third angle of incidence is selected.

42. The apparatus of claim 40 further comprising:
the at least a first plurality of pulses comprises sequential pulses for which a first angle of incidence is selected and the at least a second plurality of pulses comprises sequential pulses for which a second angle of incidence is selected and the at least a third plurality of pulses comprises sequential pulses for which a third angle of incidence is selected.

43. The apparatus of claim 37 further comprising:
at least one transition pulse intermediate each one of the at least a first plurality of pluses and each one of the at least a second plurality of pulses, with the at least one transition pulse being one for which the laser is not fired, with the total number of the first plurality of pulses and the second plurality of pulses and transition pulses equaling N pulses.

44. The apparatus of claim 38 further comprising:
at least one transition pulse between the at least a first plurality of sequential pulses and the at least one second plurality of adjacent pulses, with the at least one transition pulse being one for which the laser is not fired, with the total number of the first plurality of pulses and the second plurality of pulses and transition pulses equaling N pulses.

45. The apparatus of claim 39 further comprising:
at least one transition pulse between the at least a first plurality of sequential pulses and the second plurality of sequential pulses and at least one transition pulse between the at least a second plurality of sequential pulses and the at least a third plurality of sequential pulses, with the at least one transition pulses being ones for which the laser is not fired, with the total number of the first plurality of pulses and the second plurality of pulses and the third plurality of pulses and transition pulses equaling N pulses.

46. The apparatus of claim 40 further comprising:
at least one transition pulse between the at least a first plurality of sequential pulses and the second plurality of sequential pulses and at least one transition pulse between the at least a second plurality of sequential pulses and the at least a third plurality of sequential pulses, with the at least one transition pulses being ones for which the laser is not fired, with the total number of the first plurality of pulses and the second plurality of pulses and the third plurality of pulses and transition pulses equaling N pulses.

47. The apparatus of claim 43 further comprising:
the at least one first and second transition pulses each comprising a plurality of first and second transition pulses.

48. The apparatus of claim 44 further comprising:
the at least one first and second transition pulses each comprising a plurality of first and second transition pulses.

49. The apparatus of claim 45 further comprising:
the at least one first and second transition pulses each comprising a plurality of first and second transition pulses.

50. The apparatus of claim 46 further comprising:
the at least one first and second transition pulses each comprising a plurality of first and second transition pulses.

51. The system of claim 1 further comprising:
the wavelength controller controlling the respective center wavelengths and the difference in center wavelengths in response to at least one signal from the utilizing tool.

52. The system of claim 1 further comprising:
the wavelength controller controlling the period of a periodic wavelength control signal responsive to at least one signal from the utilizing tool.

53. The system of claim 51 further comprising:
the wavelength controller controlling the period of a periodic wavelength control signal responsive to at least one signal from the utilizing tool.

54. The system of claim 52 further comprising:
the at least one signal from the utilizing tool comprising a signal taken from the group of signals representative of the number of pulses in a scan window, a desired set of center wavelengths, a desired peak to peak separation and a desired central wavelength.

55. The system of claim 53 further comprising:
the at least one signal from the utilizing tool comprising a signal taken from the group of signals representative of the number of pulses in a scan window, a desired set of center wavelengths, a desired peak to peak separation and a desired central wavelength.

56. The system of claim 54 further comprising:
the wavelength controller selecting a periodic center wavelength modulation signal and the period of the periodic center wavelength modulation signal based upon the number of pulses in the scan window.

57. The system of claim 55 further comprising:
the wavelength controller selecting a periodic center wavelength modulation signal and the period of the periodic center wavelength modulation signal based upon the number of pulses in the scan window.

58. The system of claim 52 further comprising:
the wavelength modulation signal comprises a plurality of successive pulses of a first center wavelength and a plurality of successive pulses of a second center wavelengths and a plurality of at least one transition pulse intermediate the plurality of successive pulses of the first center wavelength and the plurality of successive pulses of the second center wavelength at each transition from the plurality of pulses at the first center wavelength to the plurality of pulses of the second center wavelength, wherein for each transition pulse the laser is not fired.

59. The system of claim 53 further comprising:
the wavelength modulation signal comprises a plurality of successive pulses of a first center wavelength and a plurality of successive pulses of a second center wavelengths and a plurality of at least one transition pulse intermediate the plurality of successive pulses of the first center wavelength and the plurality of successive pulses of the second center wavelength at each transition from the plurality of pulses at the first center wavelength to the plurality of pulses of the second center wavelength, wherein for each transition pulse the laser is not fired.

60. The system of claim 54 further comprising:
the wavelength modulation signal comprises a plurality of successive pulses of a first center wavelength and a plurality of successive pulses of a second center wavelengths and a plurality of at least one transition pulse intermediate the plurality of successive pulses of the first center wavelength and the plurality of successive pulses of the second center wavelength at each transition from the plurality of pulses at the first center wavelength to the plurality of pulses of the second center wavelength, wherein for each transition pulse the laser is not fired.

61. The system of claim 55 further comprising:
the wavelength modulation signal comprises a plurality of successive pulses of a first center wavelength and a plurality of successive pulses of a second center wavelengths and a plurality of at least one transition pulse intermediate the plurality of successive pulses of the first center wavelength and the plurality of successive pulses of the second center wavelength at each transition from the plurality of pulses at the first center wavelength to the plurality of pulses of the second center wavelength, wherein for each transition pulse the laser is not fired.

62. The system of claim 54 further comprising:
the wavelength modulation signal comprises a slow sinusoidal signal with a period determined by the period of the scan window.

63. The system of claim 55 further comprising:
the wavelength modulation signal comprises a slow sinusoidal signal with a period determined by the period of the scan window.

64. The system of claim 56 further comprising:
the wavelength modulation signal comprises a slow sinusoidal signal with a period determined by the period of the scan window.

65. The system of claim 57 further comprising:
the wavelength modulation signal comprises a slow sinusoidal signal with a period determined by the period of the scan window.

66. The system of claim 54 further comprising:
the wavelength modulation signal comprises a fast sinusoidal signal with a frequency determined by a fraction of the pulse repetition rate of the laser.

67. The system of claim 55 further comprising:
the wavelength modulation signal comprises a fast sinusoidal signal with a frequency determined by a fraction of the pulse repetition rate of the laser.

68. The system of claim 56 further comprising:
the wavelength modulation signal comprises a fast sinusoidal signal with a frequency determined by a fraction of the pulse repetition rate of the laser.

69. The system of claim 57 further comprising:
the wavelength modulation signal comprises a fast sinusoidal signal with a frequency determined by a fraction of the pulse repetition rate of the laser.

70. The system of claim 54 further comprising:
the wavelength modulation signal comprises a rounded square wave with a period determined by the period of the scan window.

71. The system of claim 55 further comprising:
the wavelength modulation signal comprises a rounded square wave with a period determined by the period of the scan window.

72. The system of claim 56 further comprising:
the wavelength modulation signal comprises a rounded square wave with a period determined by the period of the scan window.

73. The system of claim 57 further comprising:
the wavelength modulation signal comprises a rounded square wave with a period determined by the period of the scan window.

74. The system of claim 58 further comprising:
a dose controller controlling dose separately for the pulses of the first center wavelength and the pulses of the second center wavelength.

75. The system of claim 59 further comprising:
a dose controller controlling dose separately for the pulses of the first center wavelength and the pulses of the second center wavelength.

76. The system of claim 60 further comprising:
a dose controller controlling dose separately for the pulses of the first center wavelength and the pulses of the second center wavelength.

77. The system of claim 61 further comprising:
a dose controller controlling dose separately for the pulses of the first center wavelength and the pulses of the second center wavelength.

78. The system of claim 62 further comprising:
a dose controller controlling dose separately for the longer wavelength portion of the sinusoidal modulation signal and the shorter wavelength portion of the sinusoidal modulation signal.

79. The system of claim 63 further comprising:
a dose controller controlling dose separately for the longer wavelength portion of the sinusoidal modulation signal and the shorter wavelength portion of the sinusoidal modulation signal.

80. The system of claim 64 further comprising:
a dose controller controlling dose separately for the longer wavelength portion of the sinusoidal modulation signal and the shorter wavelength portion of the sinusoidal modulation signal.

81. The system of claim 65 further comprising:
a dose controller controlling dose separately for the longer wavelength portion of the sinusoidal modulation signal and the shorter wavelength portion of the sinusoidal modulation signal.

82. The system of claim 66 further comprising:
a dose controller controlling dose separately for the longer wavelength portion of the sinusoidal modulation signal and the shorter wavelength portion of the sinusoidal modulation signal.

83. The system of claim 67 further comprising:
a dose controller controlling dose separately for the longer wavelength portion of the sinusoidal modulation signal and the shorter wavelength portion of the sinusoidal modulation signal.

84. The system of claim 68 further comprising:
a dose controller controlling dose separately for the longer wavelength portion of the sinusoidal modulation signal and the shorter wavelength portion of the sinusoidal modulation signal.

85. The system of claim 69 further comprising:
a dose controller controlling dose separately for the longer wavelength portion of the sinusoidal modulation signal and the shorter wavelength portion of the sinusoidal modulation signal.

86. The system of claim 70 further comprising:
the dose controller controlling dose separately for the longer wavelength pulses generated by the rounded square wave and the shorter wavelength pulses generated by the rounded square wave.

87. The system of claim 71 further comprising:
the dose controller controlling dose separately for the longer wavelength pulses generated by the rounded square wave and the shorter wavelength pulses generated by the rounded square wave.

88. The system of claim 72 further comprising:
the dose controller controlling dose separately for the longer wavelength pulses generated by the rounded square wave and the shorter wavelength pulses generated by the rounded square wave.

89. The system of claim 73 further comprising:
the dose controller controlling dose separately for the longer wavelength pulses generated by the rounded square wave and the shorter wavelength pulses generated by the rounded square wave.

90. The system of claim 74 further comprising:
the dose controller controlling dose separately for the longer wavelength pulses generated by the rounded square wave and the shorter wavelength pulses generated by the rounded square wave.

91. The system of claim 75 further comprising:
the dose controller controlling dose separately for the longer wavelength pulses generated by the rounded square wave and the shorter wavelength pulses generated by the rounded square wave.

92. The system of claim 76 further comprising:
the dose controller controlling dose separately for the longer wavelength pulses generated by the rounded square wave and the shorter wavelength pulses generated by the rounded square wave.

93. The system of claim 77 further comprising:
the dose controller controlling dose separately for the longer wavelength pulses generated by the rounded square wave and the shorter wavelength pulses generated by the rounded square wave.

94. The system of claim 54 further comprising:
the wavelength modulation signal comprises a slow periodic signal with a period determined by the period of the scan window.

95. The system of claim 55 further comprising:
the wavelength modulation signal comprises a slow periodic signal with a period determined by the period of the scan window.

96. The system of claim 56 further comprising:
the wavelength modulation signal comprises a slow periodic signal with a period determined by the period of the scan window.

97. The system of claim 57 further comprising:
the wavelength modulation signal comprises a slow periodic signal with a period determined by the period of the scan window.

98. The system of claim 54 further comprising:
the wavelength modulation signal comprises a fast periodic signal with a frequency determined by a fraction of the pulse repetition rate of the laser.

99. The system of claim 55 further comprising:
the wavelength modulation signal comprises a fast periodic signal with a frequency determined by a fraction of the pulse repetition rate of the laser.

100. The system of claim 56 further comprising:
the wavelength modulation signal comprises a fast periodic signal with a frequency determined by a fraction of the pulse repetition rate of the laser.

101. The system of claim 57 further comprising:
the wavelength modulation signal comprises a fast periodic signal with a frequency determined by a fraction of the pulse repetition rate of the laser.

102. The system of claim 94 further comprising:
a dose controller controlling dose separately for the longer wavelength portion of the periodic modulation signal and the shorter wavelength portion of the sinusoidal modulation signal.

103. The system of claim 95 further comprising:
a dose controller controlling dose separately for the longer wavelength portion of the periodic modulation signal and the shorter wavelength portion of the sinusoidal modulation signal.

104. The system of claim 96 further comprising:
a dose controller controlling dose separately for the longer wavelength portion of the periodic modulation signal and the shorter wavelength portion of the sinusoidal modulation signal.

105. The system of claim 97 further comprising:
a dose controller controlling dose separately for the longer wavelength portion of the periodic modulation signal and the shorter wavelength portion of the sinusoidal modulation signal.

106. The system of claim 98 further comprising:
a dose controller controlling dose separately for the longer wavelength portion of the periodic modulation signal and the shorter wavelength portion of the sinusoidal modulation signal.

107. The system of claim 99 further comprising:
a dose controller controlling dose separately for the longer wavelength portion of the periodic modulation signal and the shorter wavelength portion of the sinusoidal modulation signal.

108. The system of claim 100 further comprising:
a dose controller controlling dose separately for the longer wavelength portion of the periodic modulation signal and the shorter wavelength portion of the sinusoidal modulation signal.

109. The system of claim 101 further comprising:
a dose controller controlling dose separately for the longer wavelength portion of the periodic modulation signal and the shorter wavelength portion of the sinusoidal modulation signal.

* * * * *